US011444159B2

(12) United States Patent
Ma et al.

(10) Patent No.: US 11,444,159 B2
(45) Date of Patent: Sep. 13, 2022

(54) FIELD EFFECT TRANSISTORS WITH WIDE BANDGAP MATERIALS

(71) Applicant: Intel Corporation, Santa Clara, CA (US)

(72) Inventors: Sean T. Ma, Portland, OR (US); Gilbert Dewey, Hillsboro, OR (US); Willy Rachmady, Beaverton, OR (US); Matthew V. Metz, Portland, OR (US); Cheng-Ying Huang, Hillsboro, OR (US); Harold W. Kennel, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/612,259

(22) PCT Filed: Jun. 30, 2017

(86) PCT No.: PCT/US2017/040328
§ 371 (c)(1),
(2) Date: Nov. 8, 2019

(87) PCT Pub. No.: WO2019/005114
PCT Pub. Date: Jan. 3, 2019

(65) Prior Publication Data
US 2020/0066843 A1    Feb. 27, 2020

(51) Int. Cl.
*H01L 29/10* (2006.01)
*H01L 29/205* (2006.01)
*H01L 29/66* (2006.01)
*H01L 29/775* (2006.01)
*H01L 29/78* (2006.01)

(52) U.S. Cl.
CPC ........ *H01L 29/1054* (2013.01); *H01L 29/205* (2013.01); *H01L 29/66439* (2013.01);
(Continued)

(58) Field of Classification Search
CPC .............. H01L 29/1054; H01L 29/205; H01L 29/66439; H01L 29/775; H01L 29/0673;
(Continued)

(56) References Cited

U.S. PATENT DOCUMENTS

2011/0260173 A1   10/2011  Wang et al.
2013/0270607 A1*  10/2013  Doornbos ............. H01L 29/205
                                                              257/192
(Continued)

FOREIGN PATENT DOCUMENTS

WO    WO-2017-052618    3/2017

OTHER PUBLICATIONS

International Search Report and Written Opinion for International Patent Application No. PCT/US2017/040328 dated Feb. 23, 2018, 12 pgs.
(Continued)

*Primary Examiner* — Moin M Rahman
*Assistant Examiner* — Mohammad A Rahman
(74) *Attorney, Agent, or Firm* — Schwabe, Williamson & Wyatt, P.C.

(57) ABSTRACT

An electronic device comprises a channel layer on a buffer layer on a substrate. The channel layer has a first portion and a second portion adjacent to the first portion. The first portion comprises a first semiconductor. The second portion comprises a second semiconductor that has a bandgap greater than a bandgap of the first semiconductor.

24 Claims, 12 Drawing Sheets

(52) U.S. Cl.
CPC ...... *H01L 29/66795* (2013.01); *H01L 29/775* (2013.01); *H01L 29/785* (2013.01)

(58) Field of Classification Search
CPC ............. H01L 29/66; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; B82Y 10/00
See application file for complete search history.

(56) References Cited

U.S. PATENT DOCUMENTS

| | | |
|---|---|---|
| 2014/0070276 A1 | 3/2014 | Ko et al. |
| 2014/0252478 A1* | 9/2014 | Doornbos ............. H01L 29/785 438/157 |
| 2015/0028387 A1 | 1/2015 | Majumdar et al. |
| 2015/0145003 A1 | 5/2015 | Rodder et al. |
| 2015/0214403 A1* | 7/2015 | Wu ...................... H01L 31/1828 136/255 |
| 2016/0027779 A1* | 1/2016 | Loo ..................... H01L 27/0922 257/190 |
| 2016/0197182 A1* | 7/2016 | Li ..................... H01L 29/66795 257/408 |
| 2016/0260740 A1* | 9/2016 | Degors ............... H01L 29/0653 |
| 2018/0061974 A1* | 3/2018 | Saito ................. H01L 29/66462 |

OTHER PUBLICATIONS

International Preliminary Report on Patentability for International Patent Application No. PCT/US2017/040328, dated Jan. 9, 2020, 8 pages.

* cited by examiner

FIELD EFFECT TRANSISTORS WITH WIDE BANDGAP MATERIALS

CROSS-REFERENCE TO RELATED APPLICATION

This patent application is a U.S. National Phase Application under 35 U.S.C. § 371 of International Application No. PCT/US2017/040328, filed Jun. 30, 2017, entitled "FIELD EFFECT TRANSISTORS WITH WIDE BANDGAP MATERIALS," which designates the United States of America, the entire disclosure of which is hereby incorporated by reference in its entirety and for all purposes.

FIELD

Embodiments as described herein generally relate to a field of electronic device manufacturing, and in particular, to manufacturing III-V material based electronic devices.

BACKGROUND

Generally, III-V materials have higher electron mobility and injection velocity relative to conventional silicon. III-V materials can be used for high performance electronic devices in integrated circuit manufacturing. The III-V material based devices may be used for system-on-chips ("SoCs") applications, for example, for power management integrated circuits ("ICs") and radio frequency ("RF")-power amplifiers. The III-V material based transistors may be used for high voltage and high frequency applications.

Typically, fin-based transistors are fabricated to improve electrostatic control over the channel, reduce the leakage current and overcome other short-channel effects comparing with planar transistors.

A conventional technique to fabricate a III-V transistor involves growing a narrow bandgap InGaAs channel layer on a wide bandgap GaAs buffer layer in trenches in silicon dioxide on a silicon substrate using an aspect ratio trapping (ART) technique. Generally, the ART refers to a technique that causes the defects to terminate at the silicon dioxide sidewalls of the trenches. The wide bandgap GaAs buffer layer is used to prevent parasitic leakage from a source to a drain of the transistor.

Currently, III-V material based field effect transistors (FETs) suffer from an off-state leakage associated with narrow bandgap semiconductor channel materials due to elevated band-to-band tunneling (BTBT), BTBT induced barrier lowering (BIBL), or both BTBT and BIBL comparing to conventional silicon transistors. The off-state leakage degrades the performance of the III-V transistors. For example, the off-state leakage degrades the ability of the device to completely turn off.

BRIEF DESCRIPTION OF THE DRAWINGS

Embodiments of the invention may be best understood by referring to the following description and accompanying drawings that are used to illustrate embodiments of the invention. In the drawings.

DETAILED DESCRIPTION

Figure 1:
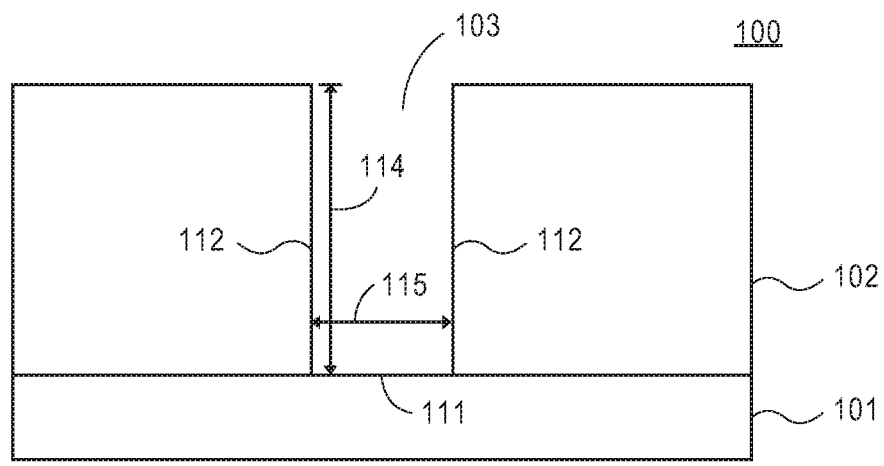
FIG. 1 is a view illustrating an electronic device structure according to one embodiment.

Methods and apparatuses to reduce a BTBT induced leakage in field effect transistors are described. In one embodiment, an electronic device comprises a channel layer on a buffer layer on a substrate. The channel layer has a first portion and a second portion adjacent to the first portion. The first portion comprises a first semiconductor. The second portion comprises a second semiconductor that has a bandgap greater than a bandgap of the first semiconductor. A gate electrode is on the channel layer. In one embodiment, the second semiconductor of the channel layer has a conduction band that has a substantially zero offset relative to the conduction band of the first semiconductor of the channel layer. In one embodiment, the second semiconductor of the channel layer has a valence band that has a substantially large offset relative to the valence band of the first semiconductor of the channel layer, as described in further detail below.

Typically, narrow bandgap III-V material based transistors have a wide bandgap material placed in source/drain regions to reduce a BTBT caused off-state leakage. The electric fields in source/drain regions, however, are not high enough to cause BTBT. As a result, the wide bandgap materials in the source/drain regions of the transistors are not substantially effective in reducing the BTBT.

In one embodiment, a transistor has a wide bandgap material that is placed in the regions having the highest electric field when the transistor is in operation (e.g., under a gate edge of the transistor) to reduce BTBT without impacting external resistance Rext comparing to conventional transistors. In one embodiment, a narrow bandgap material under a gate edge of the transistor is removed using a lateral etch to form a recess, and an intentionally undoped wide bandgap material is placed in the recess under the gate edge of the transistor, as described in further detail below.

In the following description, various aspects of the illustrative implementations will be described using terms commonly employed by those skilled in the art to convey the substance of their work to others skilled in the art. However, it will be apparent to those skilled in the art that the embodiments of the present invention may be practiced with only some of the described aspects. For purposes of explanation, specific numbers, materials and configurations are set forth in order to provide a thorough understanding of the illustrative implementations. However, it will be apparent to one skilled in the art that the embodiments of the present invention may be practiced without specific details. In other instances, well-known features are omitted or simplified in order not to obscure the illustrative implementations.

Various operations will be described as multiple discrete operations, in turn, in a manner that is most helpful in understanding the embodiments of the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1 is a view 100 illustrating an electronic device structure according to one embodiment. An insulating layer 102 is deposited on a substrate 101, as shown in FIG. 1.

A trench 103 is formed in the insulating layer 102. In at least some embodiments, trench 103 represents one of a plurality of trenches that are formed on substrate 101. As shown in FIG. 1, trench 103 has a bottom 111 that is an exposed portion of the substrate 101 and opposing sidewalls 112. In one embodiment, the bottom portion 111 of the trench 103 has slanted sidewalls that meet at an angle (not shown).

In an embodiment, the bottom portion 111 is formed by etching the exposed portion of the substrate 101 aligned along a (100) crystallographic plane (e.g., Si (100)). In one embodiment, the etch process etches the portions of the substrate aligned along a (100) crystallographic plane (e.g., Si (100)) fast and slows down at the portions of the substrate aligned along (111) crystallographic planes (e.g., Si (111)). In one embodiment, the etch process stops when the portions of Si (111) are met that results in a V-shaped bottom portion 111.

Trench 103 has a depth D 114 and a width W 115. In one embodiment, depth 114 is determined by the thickness of the insulating layer 102. In an embodiment, the width of the trench is determined by the width of the electronic device. In at least some embodiments, the electronic device has a fin based transistor architecture (e.g., FinFET, Trigate, GAA, a nanowire based device, a nanoribbons based device, or any other electronic device architecture). In one embodiment, the width 115 is from about 5 nanometers (nm) to about 300 nm. In an embodiment, the aspect ratio of the trench (D/W) is at least 1.5.

In an embodiment, the substrate 101 comprises a semiconductor material. In one embodiment, substrate 101 is a monocrystalline semiconductor substrate. In another embodiment, substrate 101 is a polycrystalline semiconductor substrate. In yet another embodiment, substrate 101 is an amorphous semiconductor substrate. In an embodiment, substrate 101 is a semiconductor-on-isolator (SOI) substrate including a bulk lower substrate, a middle insulation layer, and a top monocrystalline layer. The top monocrystalline layer may comprise any semiconductor material.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the embodiments of the present invention.

In another embodiment, substrate 101 comprises a III-V material. Generally, the III-V material refers to a compound semiconductor material that comprises at least one of group III elements of the periodic table, e.g., boron ("B"), aluminum ("Al"), gallium ("Ga"), indium ("In"), and at least one of group V elements of the periodic table, e.g., nitrogen ("N"), phosphorus ("P"), arsenic ("As"), antimony ("Sb"), bismuth ("Bi"). In an embodiment, substrate 101 comprises InP, GaAs, InGaAs, InAlAs, other III-V material, or any combination thereof.

In alternative embodiments, substrate 101 includes a group IV material layer. Generally, the group IV material refers to a semiconductor material comprising one or more elements of the group IV of the periodic table, e.g., carbon (C), silicon (Si), germanium (Ge), tin (Sn), lead (Pb), or any combination thereof. In one embodiment, substrate 101 comprises a silicon layer, a germanium layer, a silicon germanium (SiGe) layer, or any combination thereof.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD). In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 102 includes a dielectric material having k-value less than 5. In one embodiment, insulating layer 102 includes a dielectric material having k-value less than 2. In at least some embodiments, insulating layer 102 includes a nitride, oxide, a polymer, phosphosilicate glass, fluorosilicate (SiOF) glass, organosilicate glass (SiOCH), other electrically insulating layer determined by an electronic device design, or any combination thereof. In one embodiment, insulating layer 102 is a shallow trench isolation (STI) layer to provide field isolation regions that isolate one fin from other fins on substrate 101. In one embodiment, the thickness of the insulating layer 102 is at least 10 nm. In one non-limiting example, the thickness of the insulating layer 102 is in an approximate range from about 10 nm to about 2 microns (μm).

In an embodiment, the insulating layer is deposited on the substrate using one or more of the deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one embodiment, trench 103 is formed in the insulating layer 102 using one or more patterning and etching techniques known to one of ordinary skill in the art of microelectronic device manufacturing.

Figure 2:
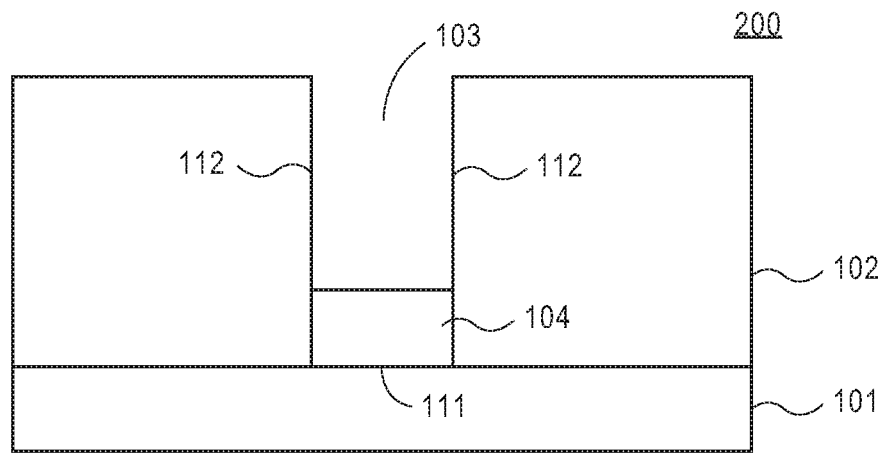
FIG. 2 is a view similar to FIG. 1 after a buffer layer is deposited onto the bottom between sidewalls of the trench according to one embodiment.

FIG. 2 is a view 200 similar to FIG. 1 after a buffer layer 104 is deposited onto the bottom 111 between sidewalls 112 and 113 of the trench 103 according to one embodiment. The buffer layer 104 is deposited to accommodate for a lattice mismatch between the substrate 101 and one or more layers above the buffer layer 104 and to confine lattice dislocations and defects.

In an embodiment, buffer layer 104 has a lattice parameter between the lattice parameter of the substrate 101 and a semiconductor layer which is formed thereon. Generally, a lattice constant is a lattice parameter that is typically referred as a distance between unit cells in a crystal lattice. Lattice parameter is a measure of the structural compatibility between different materials. In one embodiment, the buffer layer 104 has a graded bandgap that gradually changes from the interface with the substrate 101 to the interface with a semiconductor layer. In various embodiments the buffer layer 104 may have different numbers of layers or simply be a single layer.

In one embodiment, an aspect ratio D/W of the trench 103 determines the thickness of the buffer layer 104. In an embodiment, the thickness of the buffer layer 104 is such that most defects originated from the lattice mismatch are trapped within the buffer layer and are prevented from being propagated into a device semiconductor layer above the buffer layer 104 using an aspect ratio trapping (ART).

In one embodiment, buffer layer 104 has the sufficient thickness that most defects present at the bottom 111 do not reach the top surface of the buffer layer 104. In one embodiment, the thickness of the buffer layer 104 is at least about 5 nm. In one embodiment, the thickness of the buffer layer 104 is from about 5 nm to about 500 nm.

In one embodiment, the buffer layer 104 comprises a III-V material. In an embodiment, substrate 101 is a silicon substrate, and buffer layer 104 comprises a III-V material, e.g., InP, GaAs, InGaAs, InAs, InAlAs, other III-V material, or any combination thereof. In another embodiment, buffer layer 104 comprises a group IV material. In one embodiment, buffer layer 104 comprises Si, Ge, SiGe, carbon, other group IV semiconductor material, or any combination thereof.

In at least some embodiments, buffer layer 104 is deposited through trench 103 onto the bottom 111 using one of epitaxial techniques known to one of ordinary skill in the art of microelectronic device manufacturing, such as but not limited to a CVD, a PVD, an MBE, an MOCVD, an ALD, spin-on, or other epitaxial growth technique.

Figure 3:
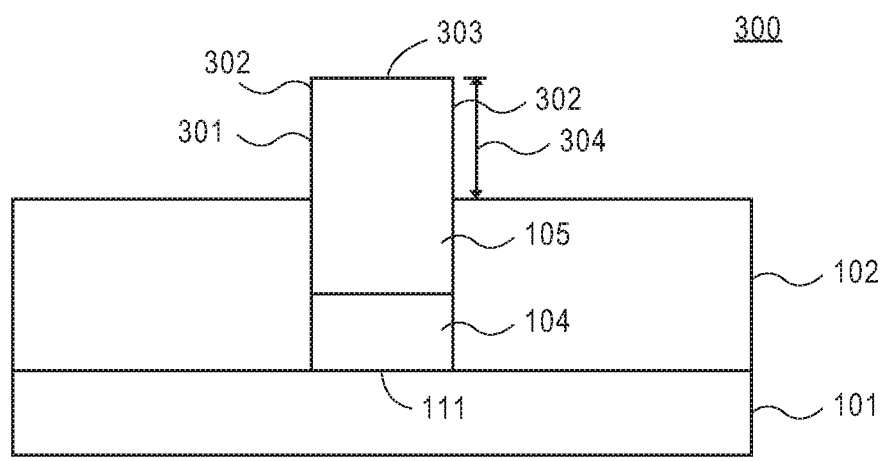
FIG. 3 is a view similar to FIG. 2 after a semiconductor channel layer is deposited on buffer layer and the insulating layer is recessed to form a fin according to one embodiment.

FIG. 3 is a view 300 similar to FIG. 2 after a semiconductor channel layer 105 is deposited on buffer layer 104 and the insulating layer 102 is recessed to form a fin 301 according to one embodiment. In one embodiment, semiconductor channel layer 105 is a narrow bandgap III-V material layer, such as but not limited to indium gallium arsenide (InGaAs), indium arsenide (InAs), indium antimonide (InSb), indium gallium antimonide (InGaSb), indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$) indium aluminum arsenide phosphide ($In_xAl_{1-x}As_yP_{1-y}$), where $0 \leq x \leq 1$, $0 \leq y \leq 1$, other narrow bandgap III-V material, or any combination thereof.

In one embodiment, semiconductor channel layer 105 is InGaAs, buffer layer 104 is GaAs, and substrate 101 is silicon. In more specific embodiment, semiconductor channel layer 105 is an $In_x Ga_{1-x}$ As layer, where x is in an approximate range from about 0.3 to about 0.7.

In one embodiment, semiconductor channel layer 105 is a part of a channel of a transistor, as described in further detail below. In one embodiment, semiconductor channel layer 105 comprises an intentionally undoped semiconductor material. In one embodiment, semiconductor channel layer 105 has a dopant concentration equal or smaller than $10^{16}$ atoms/cm$^3$. In one embodiment, the concentration of dopants in the semiconductor channel layer 105 is from about $10^{14}$ atoms/cm$^3$ to about $10^{16}$ atoms/cm$^3$.

In one embodiment, the thickness of semiconductor channel layer 105 is determined by design. In one embodiment, semiconductor channel layer 105 is a part of an electronic device, e.g., a FinFET, Trigate, gate all around (GAA), a nanowire based device, a nanoribbons based device, or any other electronic device. In one embodiment, the thickness of the semiconductor channel layer 105 is at least about 5 nm. In one embodiment, the thickness of the semiconductor channel layer 105 is from about 5 nm to about 500 nm.

In one embodiment, semiconductor channel layer 105 is deposited on the buffer layer 104 in the trench 103 and on top of the insulating layer 102. In an embodiment, semiconductor channel layer 105 is deposited using one of deposition techniques, such as but not limited to a CVD, a PVD, an MBE, an MOCVD, an ALD, spin-on, or other deposition techniques known to one of ordinary skill in the art of microelectronic device manufacturing.

The semiconductor channel layer 105 is then polished back to be planar with the top portions of the insulating layer 102 using a chemical mechanical polishing (CMP) process as known to one of ordinary skill in the art of microelectronic device manufacturing. The insulating layer 102 is then recessed down to a predetermined depth that defines a height 304 of the fin 301. In one embodiment, a patterned hard mask (not shown) is deposited onto semiconductor channel layer 105 before recessing insulating layer 102. In one embodiment, insulating layer 102 is recessed by an etching technique, such as but not limited to a wet etching, a dry etching, or any combination thereof techniques using a chemistry that has substantially high selectivity to the semiconductor channel layer 105. In one embodiment, after recessing the insulating layer 102, the patterned hard mask is removed by a chemical mechanical polishing (CMP) process as known to one of ordinary skill in the art of microelectronic device manufacturing.

As shown in FIG. 3, fin 301 is a portion of the semiconductor channel layer 105 that protrudes from a top surface of the insulating layer 102. Fin 301 comprises a top portion 303 and opposing sidewalls 302. In an embodiment, the length of the fin is substantially greater than the width. The height and the width of the fin 301 are typically determined by a design. In one embodiment, the width of the fin 301 is determined by the width 115 of the trench 103. In an embodiment, the height of the fin 301 is from about 10 nm to about 100 nm and the width of the fin 301 is from about 5 nm to about 20 nm.

In another embodiment, forming the fin 301 involves depositing the semiconductor channel layer 105 on the buffer layer 104 on the substrate 101 using one or more of deposition techniques, such as but not limited to a CVD, a PVD, an MBE, an MOCVD, an ALD, spin-on, or other deposition techniques known to one of ordinary skill in the art of microelectronic device manufacturing. A stack comprising the semiconductor channel layer 105 on the buffer layer 104 is patterned and etched using one or more fin patterning and etching techniques known to one of ordinary skill in the art of microelectronic device manufacturing to form the fin 301. The insulating layer 102 is deposited to a predetermined thickness adjacent to portions of the sidewalls of the fin stack on the substrate.

Figure 4:
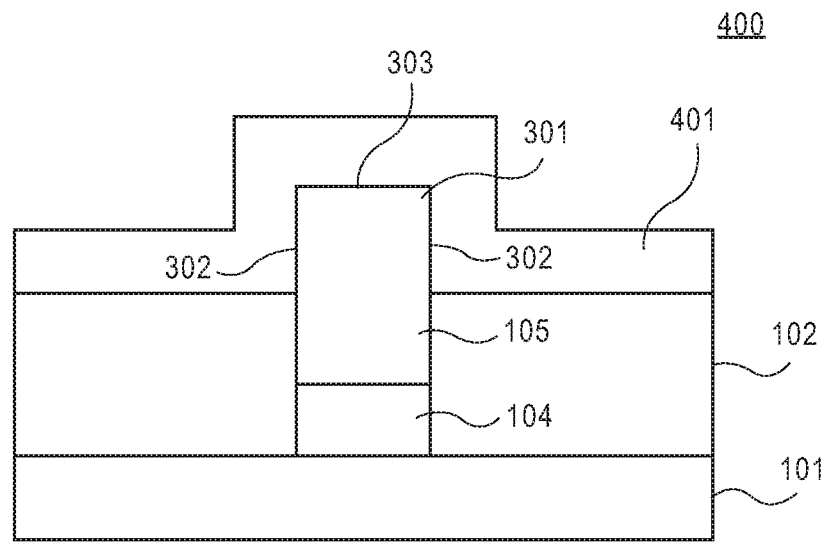
FIG. 4 is a view similar to FIG. 3 after a gate electrode is deposited on a channel portion of the semiconductor channel layer according to one embodiment.
Figure 5:
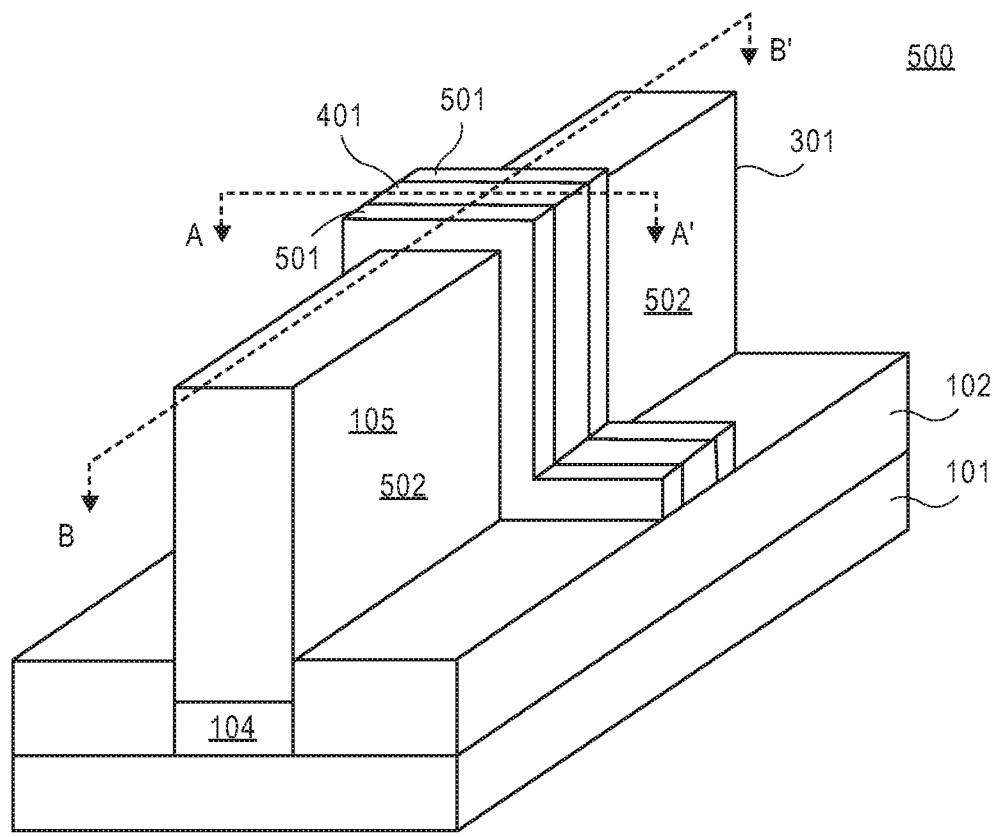
FIG. 5 is a perspective view illustrating the electronic device structure depicted in FIG. 4 according to one embodiment.

FIG. 4 is a view 400 similar to FIG. 3 after a gate electrode 401 is deposited on a channel portion of the semiconductor channel layer 105 according to one embodiment. FIG. 5 is a perspective view 500 illustrating the electronic device structure depicted in FIG. 4 according to one embodiment. In one embodiment, the electronic device structure depicted in FIGS. 5 and 4 is a transistor structure. View 400 is a cross-sectional view of the electronic device structure shown in FIG. 5 along an axis A-A' ("gate cut view") according to one embodiment. As shown in FIG. 5, an axis B-B' represents a source-drain cut view.

As shown in FIGS. 4 and 5, gate electrode 401 is deposited on and around the fin 301. Gate electrode 401 is deposited on top portion 303 and opposing sidewalls 302 of a portion of the fin 301. In one embodiment, the area of the fin 301 surrounded by the gate electrode 401 defines a channel portion of the transistor device. In one embodiment, the gate electrode 401 is a sacrificial (dummy) gate electrode.

Gate electrode 401 can be formed of any suitable gate electrode material, such as but not limited to a polysilicon, a metal, or any combination thereof. In at least some embodiments, the gate electrode 401 is deposited using one or more of the gate electrode deposition and patterning techniques known to one of ordinary skill in the art of microelectronic device manufacturing. In one embodiment, a dummy gate electrode stack comprising a dummy gate electrode on a dummy gate dielectric (not shown) is formed on the channel portion of the fin 301. Example dummy gate dielectric materials include silicon dioxide, although any suitable dummy gate dielectric material can be used.

As shown in FIG. 5, spacers 501 are formed on the opposite sidewalls of the gate electrode 401. In one embodiment, the thickness of the spacers 501 is from 1 nm to about 10 nm, or other thickness determined by design to target the tradeoffs between large S/D contact area (which requires a thin spacer) and small contact-to-gate parasitic capacitance (which requires a thick spacer).

In one embodiment, the portions 502 of the fin 301 exposed by the spacers 501 at opposite sides of the gate electrode 401 define source/drain regions of the transistor device.

In at least some embodiments, spacers 501 are formed using one or more spacer deposition techniques known to one of ordinary skill in the art of the microelectronic device manufacturing. In one embodiment, the spacers 501 are low-k dielectric spacers. In one embodiment, the spacers 501 are nitride spacers (e.g., silicon nitride), oxide spacers, carbide spacers (e.g., silicon carbide), or other spacers.

As shown in FIGS. 4 and 5, the electronic device has gate electrode 401 surrounding the fin 301 on three sides that provides three channels on the fin 301, one channel extends between the source and drain regions on one of the sidewalls 302 of the fin 301, a second channel extends between the source and drain regions on the top portion 303 of the fin 301, and the third channel extends between the source and drain regions on the other one of the sidewalls 302 of the fin 301. As shown in FIGS. 4 and 5, gate electrode 401 has a top portion and laterally opposite sidewalls separated by a distance that defines the length of the channel on the fin 301. In one embodiment, the length of the channel on the fin 301 is from about 5 nanometers (nm) to about 300 nm. In one embodiment, the length of the channel on the fin 301 is from about 10 nm to about 20 nm.

Figure 6:
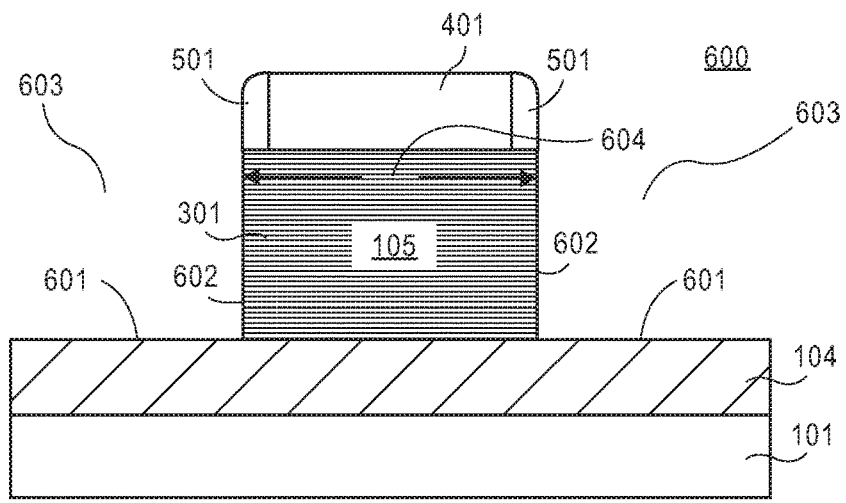
FIG. 6 is a view similar to FIG. 4, after portions of the semiconductor channel layer are removed according to one embodiment.

FIG. 6 is a view 600 similar to FIG. 4, after portions 502 of the semiconductor channel layer 105 are removed according to one embodiment. View 600 is a cross-sectional view of the electronic device structure shown in FIG. 5 along axis B-B', after portions 502 are removed. As shown in FIG. 6, portions 502 of the semiconductor channel layer 105 are removed to form recesses 603. As shown in FIG. 6, the recesses 603 is defined by the exposed portion 601 of the buffer layer 104 and the sidewall 602 of the semiconductor channel layer 105 underneath the edge of the spacer 501. As shown in FIG. 6, the remaining semiconductor channel layer 105 has a width 604 that is defined by the width of the gate electrode 401 and the thickness of the spacers 501.

In one embodiment, recesses 603 are formed by etching portions 502 of the semiconductor channel layer 105 outside the gate electrode 401 and spacers 501. In one embodiment, gate electrode 401 and spacers 501 are used as a mask to selectively remove portions 502 of the semiconductor channel layer 105. In one embodiment, portions 502 are selectively removed using one of the dry etching techniques known to one of ordinary skill in the art of the microelectronic device manufacturing.

Figure 7:
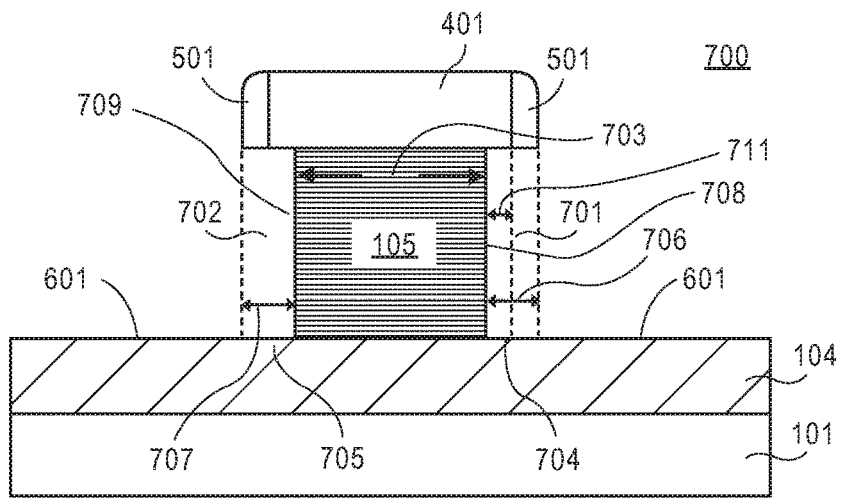
FIG. 7 is a view similar to FIG. 6, after portions of the semiconductor channel layer underneath the spacers and gate electrode are removed to form undercut regions according to one embodiment.

FIG. 7 is a view 700 similar to FIG. 6, after portions of the semiconductor channel layer 105 underneath the spacers 501 and gate electrode 401 are removed to form undercut regions 701 and 702 according to one embodiment. In one embodiment, undercut regions 701 and 702 are formed by a lateral wet etch of the portions of the semiconductor channel layer 105 underneath spacers 501. As shown in FIG. 7, the remaining semiconductor channel layer 105 has a width 703 that is smaller than the width 604. As shown in FIG. 7, undercut region 701 of the semiconductor channel layer 105 extends laterally underneath the gate electrode 401 from the edge of one the spacers 501 to a width 706. The undercut region 701 exposes a portion 704 of the buffer layer 104. Undercut region 702 of the semiconductor channel layer 105 extends laterally underneath the gate electrode 401 from the edge of the other one of the spacers 501 to a width 707. Undercut region 702 exposes a portion 705 of the buffer layer 104. As shown in FIG. 7, the undercut region 701 is defined by the exposed portion 704 of the buffer layer 104 and the sidewall 708 of the remaining semiconductor channel layer 105 underneath the gate electrode 401. The undercut region 702 is defined by the exposed portion 705 of the buffer layer 104 and the sidewall 709 of the remaining semiconductor channel layer 105 underneath the gate electrode 401.

In one embodiment, each of the width 706 and 707 is from about 5 nm to about 20 nm, or other width determined by design, depending on the width of the spacer 501. In one embodiment, widths 706 and 707 are substantially similar. As shown in FIG. 7, each of the undercut regions 701 and 702 extends from the corresponding edge of the gate electrode 401 beneath the gate electrode 401 to a predetermined width, such as a width 711. In one embodiment, the width 711 is from about 5 nm to about 10 nm, depending on the width of the semiconductor channel layer 105, or other width determined by design for a target off-state leakage.

In one embodiment, the portions of the semiconductor channel layer 105 underneath the spacers 501 and gate electrode 401 are selectively removed using one of the wet etching techniques known to one of ordinary skill in the art of the microelectronic device manufacturing. Examples of etch processes are aqueous hydrochloride solution (wet etch) or plasma-based Cl2/H2/Ar dry etch.

Figure 8:
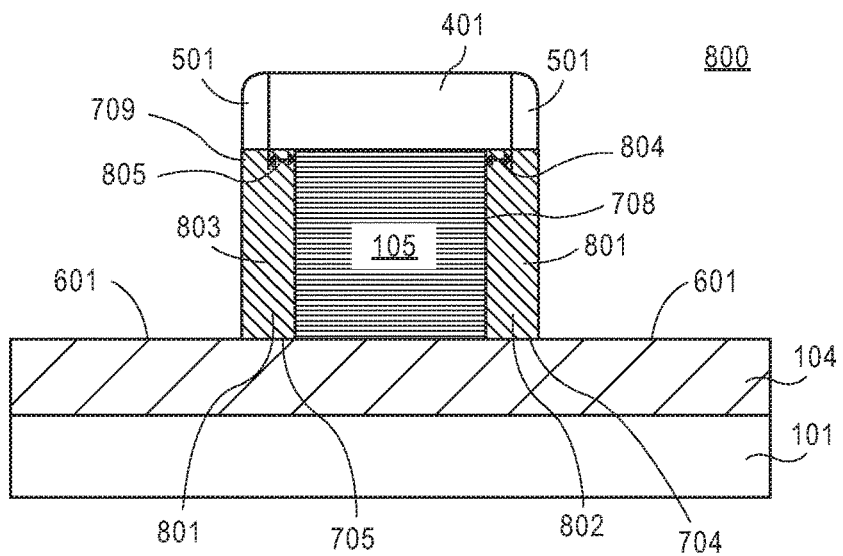
FIG. 8 is a view similar to FIG. 7, after a semiconductor channel layer is deposited in the undercut regions according to one embodiment.

FIG. 8 is a view 800 similar to FIG. 7, after a semiconductor channel layer 801 is deposited in the undercut regions 701 and 702 according to one embodiment. As shown in FIG. 8, a portion 802 of the semiconductor channel layer 801 is deposited on sidewall 708 and portion 704 of the buffer layer 104. A portion 803 of the semiconductor channel layer 801 is deposited on sidewall 709 and portion 705 of the buffer layer 104. As shown in FIG. 8, portion 802 of the semiconductor channel layer 801 extends from the edge of the gate electrode 401 laterally underneath the gate electrode 401 to a width 804. The portion 803 of the semiconductor channel layer 801 extends from the edge of the gate electrode 401 laterally underneath the gate electrode 401 to a width 805. In one embodiment, each of the widths 804 and 805 is from about 5 nm to about 10 nm, depending on the width of the semiconductor channel layer 105, or other width determined by design for a target off-state leakage. In one embodiment, widths 804 and 805 are substantially similar.

In one embodiment, the semiconductor channel layer 801 is a wide bandgap material layer that has a bandgap greater than a bandgap of the semiconductor channel layer 105. In one embodiment, the semiconductor channel layer 801 has a conduction band that has a zero offset relative to the conduction band of the semiconductor channel layer 105. In one embodiment, the semiconductor channel layer 801 has a valence band that has a substantially large offset relative to the valence band of the semiconductor channel layer 105, as described in further detail below. In one embodiment, the semiconductor channel layer 801 is an undoped semiconductor material. In one embodiment, the semiconductor channel layer 801 has a dopant concentration equal or smaller than $10^{16}$ atoms/cm$^3$. In one embodiment, the semiconductor channel layer 801 has a dopant concentration from about $10^{14}$ atoms/cm$^3$ to about $10^{16}$ atoms/cm$^3$.

In one embodiment, each of the semiconductor channel layer 105 and the semiconductor channel layer 801 comprises a III-V semiconductor material. In one embodiment, the semiconductor channel layer 801 is a III-V material layer, such as but not limited to gallium arsenide (GaAs), indium phosphide (InP), gallium phosphide (GaP), indium gallium phosphide (InGaP), aluminum gallium arsenide ($Al_xGa_{1-x}As$), gallium arsenide antimonide ($GaAs_xSb_{1-x}$) (where $0 \le x \le 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide $In_xGa_{1-x}P_ySb_{1-y}$ (where $0 \le x \le 0.3$, $0 \le y \le 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \le x \le 1$, $0 \le y \le 1$), or any combination thereof.

In one embodiment, the semiconductor channel layer 801 is deposited in the undercut regions 701 and 702 through the recesses 603 and on exposed portions 601 of the buffer layer 104 and on top of the gate electrode 401 and spacers 501. In one embodiment, the portions of the semiconductor channel layer 801 on the exposed portions 601 of the buffer layer 104 and top of the gate electrode 401 and spacers 501 are selectively removed while retaining the sidewall portions 801 and 802 using one of the dry etching techniques known to one of ordinary skill in the art of the microelectronic device manufacturing. In another embodiment, the semiconductor channel layer 801 is selectively grown in the undercut regions 701 and 702. In an embodiment, the semiconductor channel layer 801 is deposited using one or more of the deposition techniques, such as but not limited to a CVD, a PVD, an MBE, an MOCVD, an ALD, spin-on, or other deposition technique.

Figure 9:
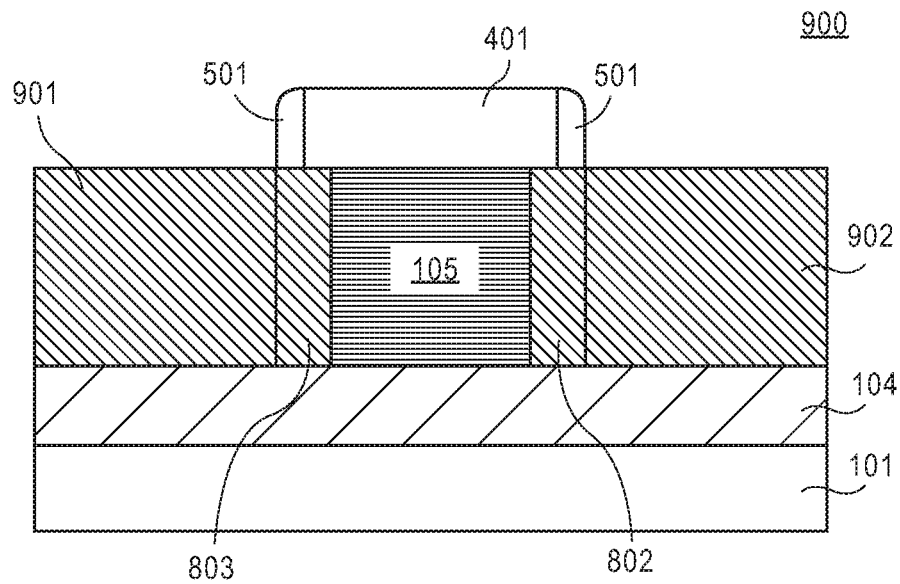
FIG. 9 is a view similar to FIG. 8, after source/drain regions are formed in recesses according to one embodiment.

FIG. 9 is a view 900 similar to FIG. 8, after source/drain regions 901 and 902 are formed in recesses 603 according to one embodiment. In one embodiment, the source/drain regions 901 and 902 comprise a wide bandgap semiconductor that has a bandgap greater than a bandgap of the semiconductor channel layer 105. In one embodiment, the source/drain regions 901 and 902 comprise a III-V material layer, such as but not limited to gallium arsenide (GaAs), indium phosphide (InP), gallium phosphide (GaP), indium gallium phosphide (InGaP), indium arsenide (InAs), $Al_xGa_{1-x}As$, $GaAs_xSb_{1-x}$ (where $0 \le x \le 1$), $In_xGa_{1-x}As_ySb_{1-y}$, $In_xGa_{1-x}As_yP_{1-y}$, $In_xGa_{1-x}P_ySb_{1-y}$ (where $0 \le x \le 0.3$, $0 \le y \le 1$), $In_xAl_{1-x}As_ySb_{1-y}$, $In_xAl_{1-x}As_yP_{1-y}$ (where $0.8 \le x \le 1$, $0 \le y \le 1$), or any combination thereof.

In one embodiment, the material of the source/drain regions 901 and 902 is similar to that of the material of the semiconductor channel layer 801. In another embodiment, the material of the source/drain regions 901 and 902 is different from that of the semiconductor channel layer 801. In one specific embodiment, the material of the semiconductor channel layer 105 is InGaAs, the material of the semiconductor channel layer 801 is InP and the material of the source/drain regions 901 and 902 is InAs.

In at least some embodiments, the source/drain regions 901 and 902 are formed of the same conductivity type such as N-type or P-type conductivity. In another embodiment, the source and drain regions 901 and 902 are doped of opposite type conductivity. In one embodiment, the dopant concentration in the source/drain regions 901 and 902 is substantially greater than in the semiconductor channel layer 105 and the semiconductor channel layer 801. In an embodiment, the channel portion of the fin including semiconductor channel layer 105 and portions of the semiconductor channel layer 801 is intrinsic or undoped. In one embodiment, the source/drain regions 901 and 902 have a dopant concentration of at least $1 \times 10^{19}$ atoms/cm$^3$. In one embodiment, the concentration of the dopants in the source/drain regions 901 and 902 is from about $10^{18}$ atoms/cm$^3$ to about $10^{22}$ atoms/cm$^3$.

In an embodiment, the channel portion of the fin including semiconductor channel layer 105 and portions of the semiconductor channel layer 801 is doped, for example to a conductivity level of equal or smaller than $1 \times 10^{16}$ atoms/cm$^3$. In an embodiment, when the channel portion is doped it is typically doped to the opposite conductivity type of the source/drain portion. For example, when the source/drain regions are N-type conductivity the channel portion would be doped to a P-type conductivity. Similarly, when the source/drain regions are P-type conductivity the channel portion would be N-type conductivity. In this manner a fin based transistor can be formed into either a NMOS transistor or a PMOS transistor respectively. The channel portion can be uniformly doped or can be doped non-uniformly or with differing concentrations to provide particular electrical and performance characteristics. For example, channel portion can include halo regions, if desired. The source/drain regions 901 and 902 can be formed of uniform concentration or can include sub-regions of different concentrations or doping profiles such as tip regions (e.g., source/drain extensions). In an embodiment, the source/drain regions 901 and 902 have the same doping concentration and profile. In an embodiment, the doping concentration and profile of the source/drain regions 901 and 902 vary to obtain a particular electrical characteristic. In at least some embodiments, source/drain regions 901 and 902 are deposited into recesses 603 using one or more of deposition techniques known to one of ordinary skill in the art of microelectronic device manufacturing, such as but not limited to a CVD, a PVD, an MBE, an MOCVD, an ALD, spin-on, or other deposition technique.

Figure 10:
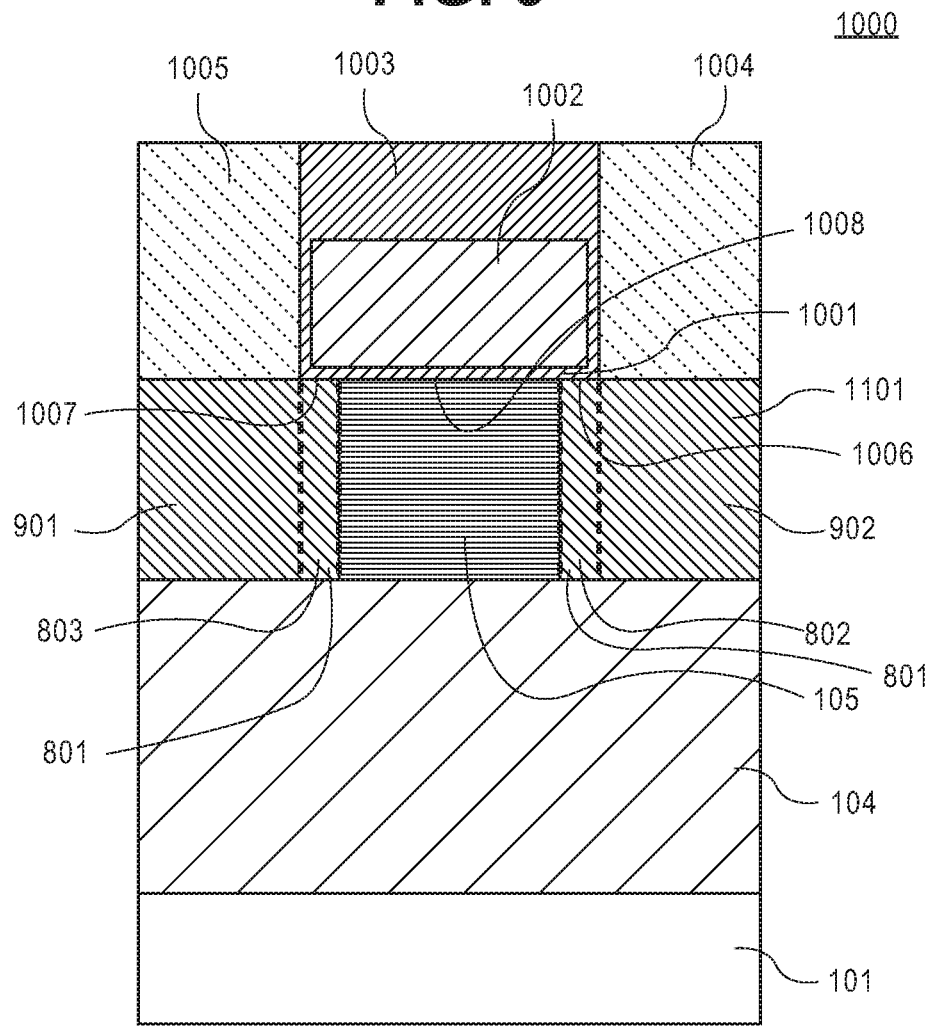
FIG. 10 is a view similar to FIG. 9, after a metal gate stack is deposited on a gate dielectric on the semiconductor channel layer and contacts are formed on source/drain regions according to one embodiment.
Figure 11:
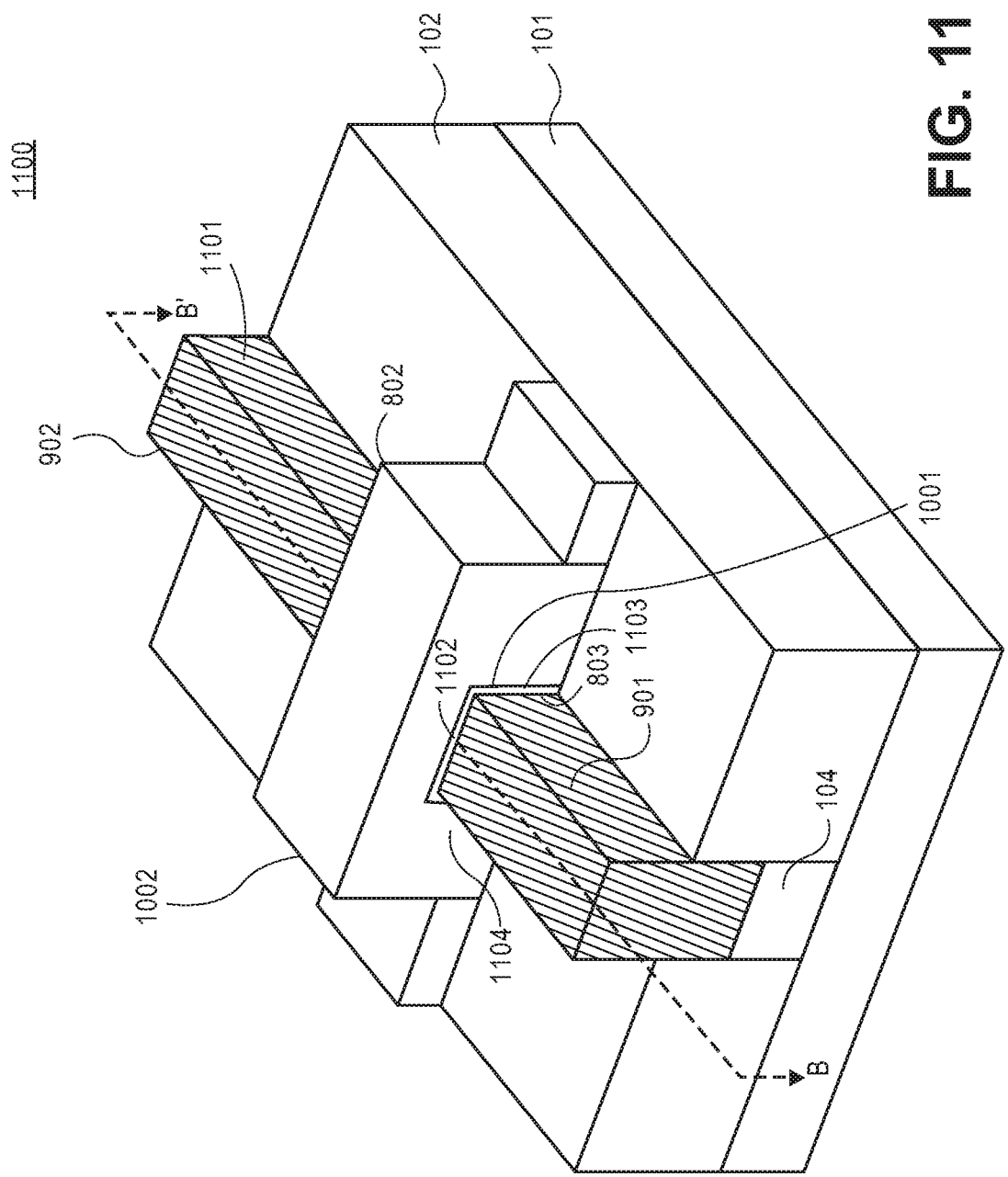
FIG. 11 is a perspective view illustrating the electronic device structure according to one embodiment.

FIG. 10 is a view 1000 similar to FIG. 9, after a metal gate stack 1002 is deposited on a gate dielectric 1001 on the semiconductor channel layer 105 and contacts 1004 are formed on source/drain regions 901 and 902 according to one embodiment. FIG. 11 is a perspective view 1100 illustrating the electronic device structure according to one embodiment. Perspective view 1100 represents a portion of the electronic device structure depicted in FIG. 10 without contacts 1004 and 1005 and a capping insulating layer 1003. FIG. 10 represents a cross-sectional view of a portion of the electronic device structure depicted in FIG. 11 along an axis B-B' (source-drain cut view) according to one embodiment.

As shown in FIGS. 10 and 11, gate electrode 401 is removed and replaced with the metal gate stack 1002 on the gate dielectric 1001. In one embodiment, a protection layer (not shown), e.g., a nitride etch stop layer (NESL) is deposited on source/drain regions 901 and 902 to selectively remove sacrificial gate electrode 401. In one embodiment, gate electrode 401 is removed to form a trench having exposed semiconductor channel layer 105 and portions 1006 and 1007 of semiconductor channel layer 801 as a bottom and spacers 501 as opposing sidewalls. The dummy gate electrode can be removed using one or more of the dummy gate electrode removal techniques known to one of ordinary skill in the art of electronic device manufacturing.

As shown in FIGS. 10 and 11, gate dielectric 1001 is deposited on the exposed portions of the semiconductor channel layer 105 and semiconductor channel layer 801. In one embodiment, gate dielectric 1001 is an oxide layer, e.g., a silicon oxide layer, an aluminum oxide, a hafnium containing oxide, or any combination thereof. In one embodiment, the gate dielectric 1001 is a high-k dielectric material, for example, hafnium oxide, hafnium silicon oxide, hafnium zirconium oxide (HfxZryOz), lanthanum oxide (La2O3), lanthanum aluminum oxide, zirconium oxide, zirconium silicon oxide, tantalum oxide, tantalum silicate (TaSiOx), titanium oxide, barium strontium titanium oxide, barium titanium oxide, strontium titanium oxide, yttrium oxide, aluminum oxide (e.g., Al2O3), lead scandium tantalum oxide, and lead zinc niobate, or other high-k dielectric materials. In one embodiment, the thickness of the gate dielectric 1001 is from about 2 angstroms (Å) to about 20 Å.

In an embodiment, the gate dielectric 1001 is deposited using one or more of the deposition techniques, such as but not limited to a CVD, a PVD, an MBE, an MOCVD, an ALD, spin-on, or other gate dielectric deposition technique. In one embodiment, the metal gate stack 1002 is formed on the gate dielectric 1001 filling the trench between the spacers. In one embodiment, the metal gate stack 1002 is a metal gate electrode layer, such as but not limited to, tungsten, tantalum, titanium, and their nitrides. It is to be appreciated, the metal gate electrode stack need not necessarily be a single material and can be a composite stack of thin films, such as but not limited to a polycrystalline silicon/metal electrode or a metal/polycrystalline silicon electrode. The metal gate stack 1002 can be deposited using one of the gate electrode layer deposition techniques, such as but not limited to a CVD, PVD, MBE, MOCVD, ALD, spin-on, electroless, electro-plating, or other deposition techniques known to one of ordinary skill in the art of microelectronic device manufacturing.

As shown in FIGS. 10 and 11, the metal gate stack 1002 is deposited on and around a fin 1101. The fin 1101 includes semiconductor channel layer 105, portions 802 and 803 of the semiconductor channel layer 801 and source/drain regions 902 and 901. The metal gate stack 1002 is deposited on a top portion 1102 and opposing sidewalls 302 of a portion of the fin 1101 that includes semiconductor channel layer 105 and portions of the semiconductor channel layer 801. In one embodiment, the area of the fin 1101 surrounded by the metal gate stack 1002 defines a channel portion of the transistor device.

As shown in FIG. 10, portion 801 of the semiconductor channel layer 801 extends from the edge of the metal gate stack 1002 laterally underneath the metal gate stack 1002 to a width 1007. Portion 802 of the semiconductor channel layer 801 extends from the edge of the metal gate stack 1002 laterally underneath the metal gate stack 1002 to a width 1006. As shown in FIG. 10, a channel region 1008 includes the narrow bandgap semiconductor channel layer 105 between portions of the wide bandgap semiconductor channel layer 801. In one embodiment, each of the widths 1006 and 1007 is from about 5 nm to about 10 nm, or other width determined by design.

As shown in FIGS. 10 and 11, the metal gate stack 1002 surrounds the fin 1101 on three sides that provides three channels on the fin 1101, one channel extends between the source/drain regions 901 and 902 on one of the sidewalls 1103 of the fin 1101, a second channel extends between the source/drain regions 901 and 902 on the top portion 1102 of the fin 1101, and the third channel extends between the source/drain regions 901 and 902 on the sidewall 1104 of the fin 1101. As shown in FIGS. 10 and 11, metal gate stack 1002 has a top portion and laterally opposite sidewalls separated by a distance that defines the length of the channel on the fin 1101. In one embodiment, the length of the channel on the fin 1101 is from about 5 nanometers (nm) to about 300 nm. In one embodiment, the length of the channel on the fin 1101 is from about 10 nm to about 20 nm.

As shown in FIG. 10, contacts 1004 are formed on source/drain regions 901 and 902. In one embodiment, after the metal gate stack 1002 is formed, the protection layer (not shown) on source/drain regions 901 and 902 is removed using one of the protection layer etching techniques known to one of ordinary skill in the art of microelectronic device manufacturing. As shown in FIG. 10, contact 1004 is deposited on source/drain region 902 and contact 1005 is deposited on source/drain region 901.

In one embodiment, contacts 1004 and 1005 are metal contacts that include a metal, such as but not limited to copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, other metals, or any combination thereof. In alternative embodiments, examples of the conductive materials that may be used for the contacts are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In an embodiment, the contacts are deposited using one of contact deposition techniques, such as but not limited to a CVD, PVD, MBE, MOCVD, ALD, spin-on, electroless, electro-plating, or other contact deposition techniques known to one of ordinary skill in the art of microelectronic device manufacturing. In one embodiment, metal gate stack 1002 between spacers 501 is recessed back to a predetermined height, then the spacers 501 are removed and a capping insulating layer 1003 is deposited on the recessed metal gate stack 1002 to encapsulate the metal gate stack 1002. In one embodiment, the material of the capping insulating layer 1003 is represented by one or more of the insulating layer materials described above with respect to insulating layer 102.

Figure 12:
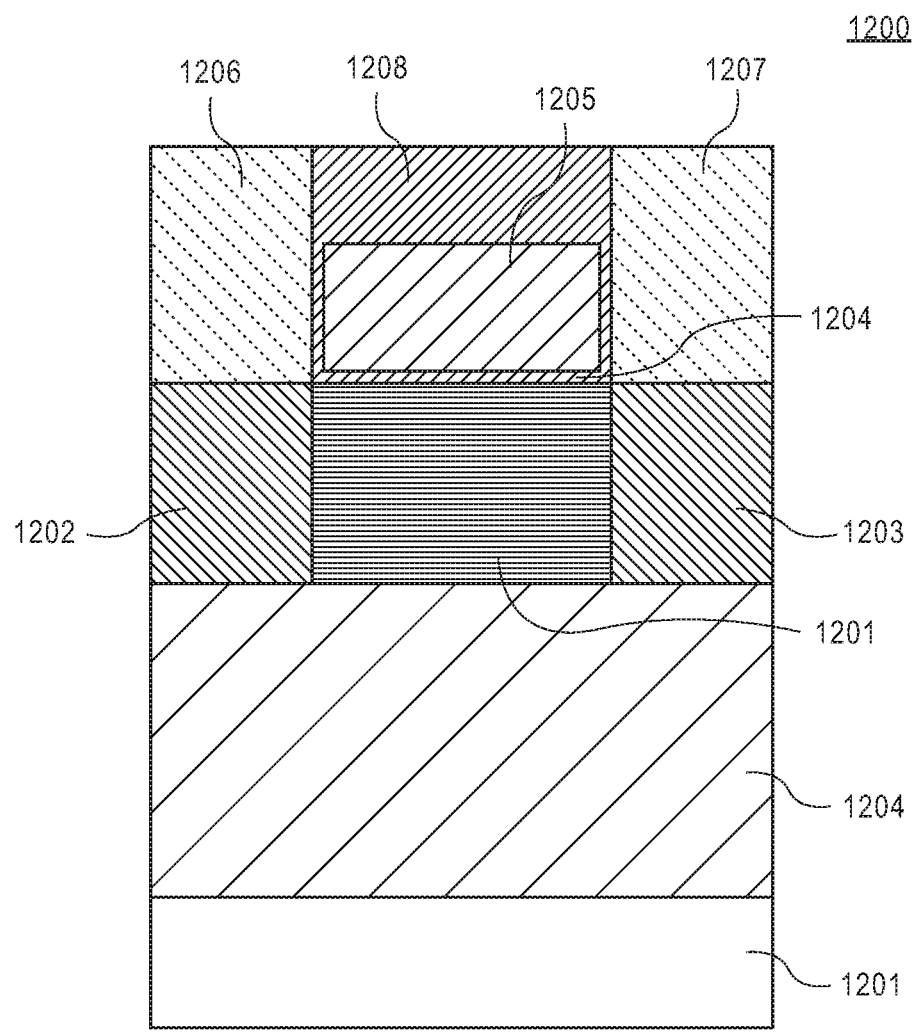
FIG. 12 is a view illustrating an electronic device structure according to one embodiment.

FIG. 12 is a view 1200 illustrating an electronic device structure according to one embodiment. As shown in FIG. 12, a metal gate stack 1205 is deposited on a gate dielectric 1204 on a semiconductor channel layer 1201 on a buffer layer 1204 on a substrate 1201. Contacts 1206 and 1207 are formed on source/drain regions 1202 and 1203 on buffer layer 1204 on substrate 1201. A capping insulating layer 1208 is deposited on the metal gate stack 1205 to encapsulate the metal gate stack 1205.

In one embodiment, substrate 1201 represents one of the substrates described above with respect to substrate 101. In one embodiment, buffer layer 1204 represents one of the buffer layers described above with respect to buffer layer 1204. In one embodiment, the semiconductor channel layer 1201 represents one of the narrow bandgap semiconductor channel layers described above with respect to the narrow bandgap semiconductor channel layer 105. In one embodiment, the gate dielectric 1204 represents one of the gate dielectrics described above with respect to the gate dielectric 1001. In one embodiment, the metal gate stack 1205 represents one of the metal gate stacks described above with respect to the metal gate stack 1002. In one embodiment, the source/drain regions 1202 and 1203 represent the source/drain regions described above with respect to the source/drain regions 901 and 902. In one embodiment, the contacts 1206 and 1207 represent the contacts described above with respect to contacts 1003 and 1004. In one embodiment, the capping insulating layer 1208 represent one of the capping insulating layers described above with respect to the capping insulating layer 1003.

FIG. 12 is different from FIG. 11 in that the wide bandgap semiconductor material is deposited only in the source/drain regions 1202 and 1203. In the source/drain regions 1202 and 1203 the electric field is not high enough to cause BTBT. As a result, the wideband gap materials deposited in the source/drain regions are not substantially effective in the BTBT reduction, as described in further detail below.

Figure 13:
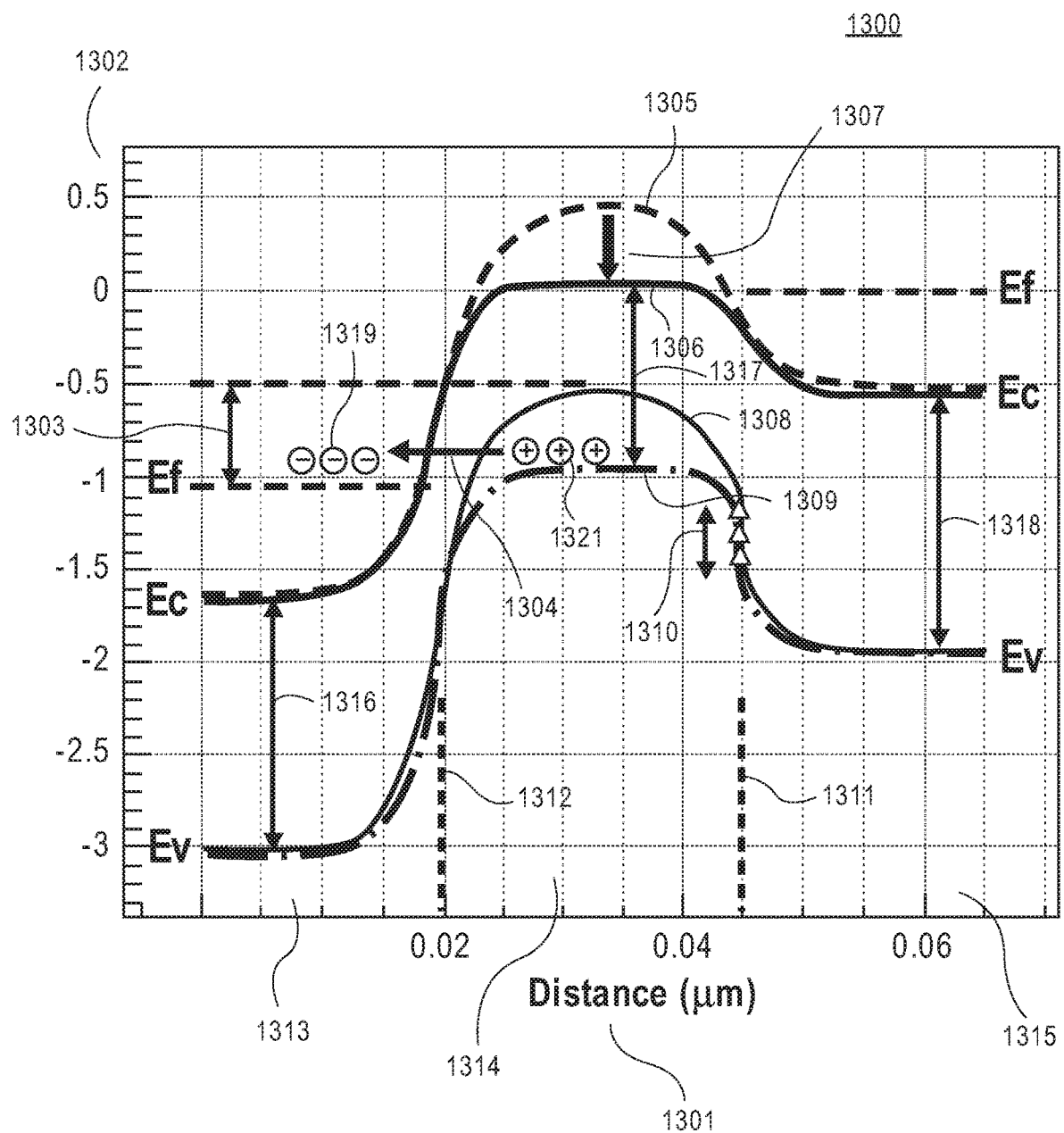
FIG. 13 is a view illustrating an energy band diagram of the electronic device structure according to one embodiment.

FIG. 13 is a view 1300 illustrating an energy band diagram of the electronic device structure according to one embodiment. As shown in FIG. 13, the energy band diagram includes an energy 1302 of electric current carriers, such as electrons and holes as a function of a distance 1301 along the electronic device structure. The electronic device structure includes a wide bandgap drain region 1313 adjacent to a narrow bandgap channel region 1314 adjacent to a wide bandgap source region 1315. In one embodiment, the narrow bandgap channel region 1314 represents the semiconductor channel layer 1201, and the wide bandgap drain region 1313 and wide bandgap source region 1315 represent the wide bandgap source/drain regions 1202 and 1203 depicted in FIG. 12.

The narrow bandgap channel region 1314 is beneath the gate electrode (not shown). As shown in FIG. 13, the narrow bandgap channel region 1314 is within the edges 1311 and 1312 of the gate electrode. As shown in FIG. 13, the wide bandgap drain region 1313 and the wide bandgap source region 1315 are outside of the gate electrode edges 1311 and 1312.

As shown in FIG. 13, the wide bandgap drain region 1313 has a conduction energy band $E_c$ and a valence energy band $E_v$ that are separated by a bandgap Eg 1316, narrow bandgap channel region 1314 has a conduction energy band $E_c$ and a valence energy band $E_v$ that are separated by a bandgap Eg 1317 and the wide bandgap source region 1315 has a conduction energy band $E_c$ and a valence energy band $E_v$ that are separated by a bandgap Eg 1318. As shown in FIG. 13, each of the bandgap 1318 and bandgap 1316 is greater than a bandgap Eg 1317 of the narrow bandgap channel region 1314. As shown in FIG. 13, the valence band of the wide bandgap source region 1315 has a valence band offset VBO 1310 at the gate edge 1311 relative to the valence band of the narrow bandgap channel region 1314. Generally, the VBO is defined as a valence band discontinuity at the interface between the wide bandgap semiconductor and the narrow bandgap semiconductor.

As shown in FIG. 13, electrons 1319 tunnel 1304 from the valence band Ev of the narrow bandgap channel region 1314 to the conduction band Ec of the wide bandgap drain region 1313 above the Fermi level Ef leaving holes 1321 in the narrow bandgap channel region 1314. As shown in FIG. 13, electron tunneling 1304 occurs within a BTBT window 1303. As shown in FIG. 13, the BTBT increases a floating charge that lowers an energy of the valence band Ev in the narrow bandgap region 1314 from an energy 1308 to an energy 1309. Generally, the BTBT window is defined as a distance between the valence band Ev in the narrow bandgap semiconductor and the Fermi level Ef in the wide bandgap semiconductor. The electron tunneling from the narrow bandgap channel region 1314 to the wide bandgap drain region 1313 within the BTBT window 1303 increases the off-state leakage current Id. As shown in FIG. 13, the valence band offset (VBO) 1310 is outside the BTBT window 1303.

As shown in FIG. 13, the BTBT reduces an energy barrier from a conduction band level 1305 to a conduction band level 1306 for thermal electrons that travel from the wide bandgap region 1315 to the narrow bandgap channel region 1314 above the Fermi level. The BTBT induced barrier lowering (BIBL) 1307 further increases the off-state leakage current Id.

Figure 14:
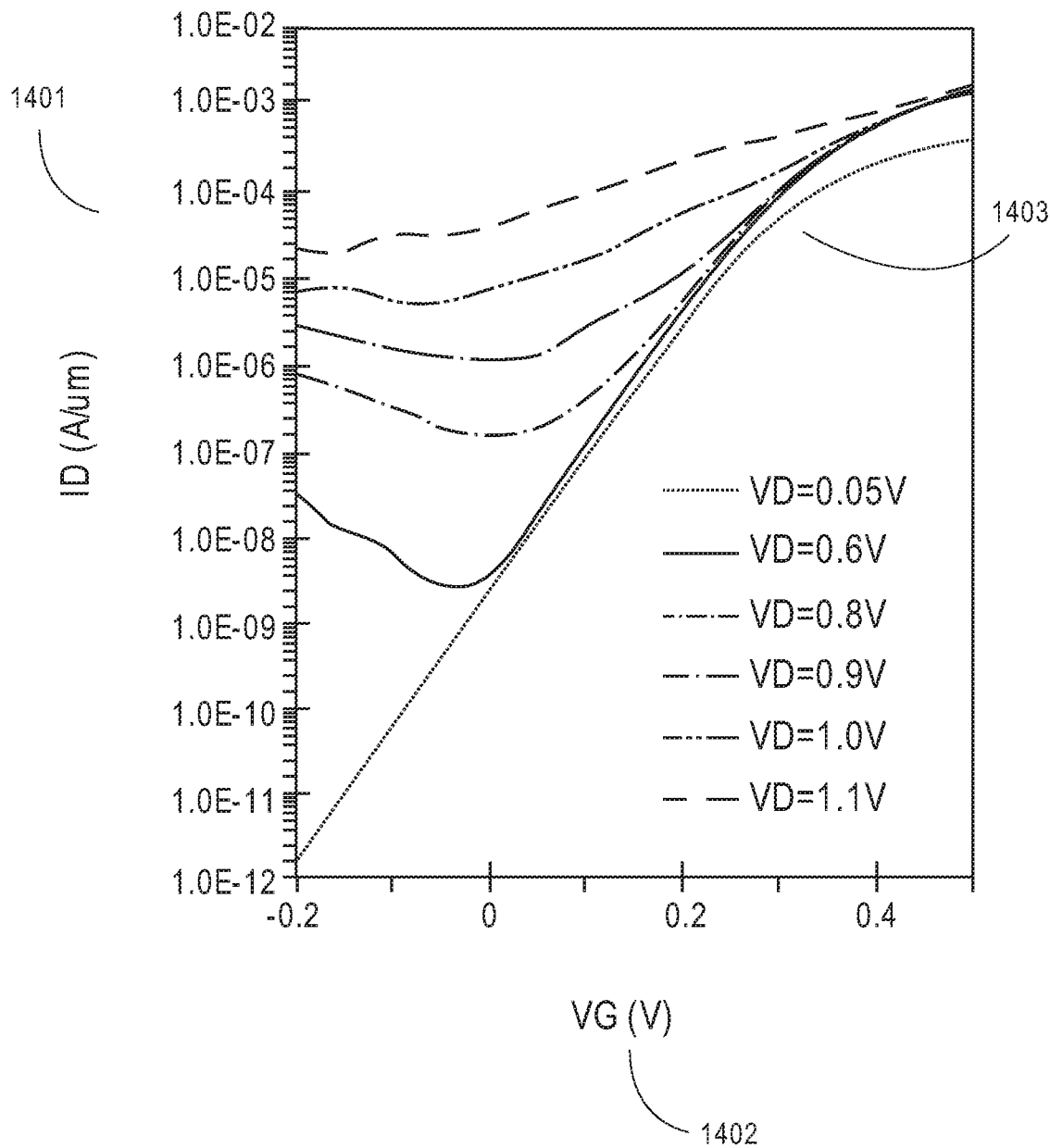
FIG. 14 is a view of a graph including a set of curves showing an off-state leakage drain current Id of a narrow bandgap transistor as a function of a gate voltage Vg at different drain voltages according to one embodiment.

FIG. 14 is a view 1400 of a graph including a set of curves 1403 showing an off-state leakage drain current Id 1401 of a narrow bandgap transistor as a function of a gate voltage Vg 1402 at different drain voltages according to one embodiment. In one embodiment, the narrow bandgap transistor has a structure that is similar to the narrow bandgap electronic device structure depicted in FIG. 12. In one embodiment, the transistor has InP source/drain regions, InGaAs channel region, where the heterojunctions of InP source/drain and InGaAs channel are at the gate edges (XUD=0). As shown in FIG. 14, when the narrow bandgap transistor is turned off (voltage at the gate electrode Vg is zero), the gate induced drain leakage (GIDL) Id increases as the bias voltage between the source and drain Vd increases. Typically, for the conventional narrow bandgap transistor devices, the off-state GIDL Id is elevated due to the BTBT or a combination of the BTBT and BIBL. In the latter case, the BTBT induced charge in the channel cannot easily flow into the substrate electrode, but floats inside the channel and the GIDL Id is due to both the BTBT and BIBL. The BTBT induced charge floats in the channel because there is no substrate or because there is an energy barrier which the BTBT induced charge cannot overcome. The type of devices in which the floating charge can occur include silicon on insulator (SOI) devices, gate-all-around devices, nanowire devices, nanoribbon devices, quantum well devices, or other electronic devices.

Figure 15:
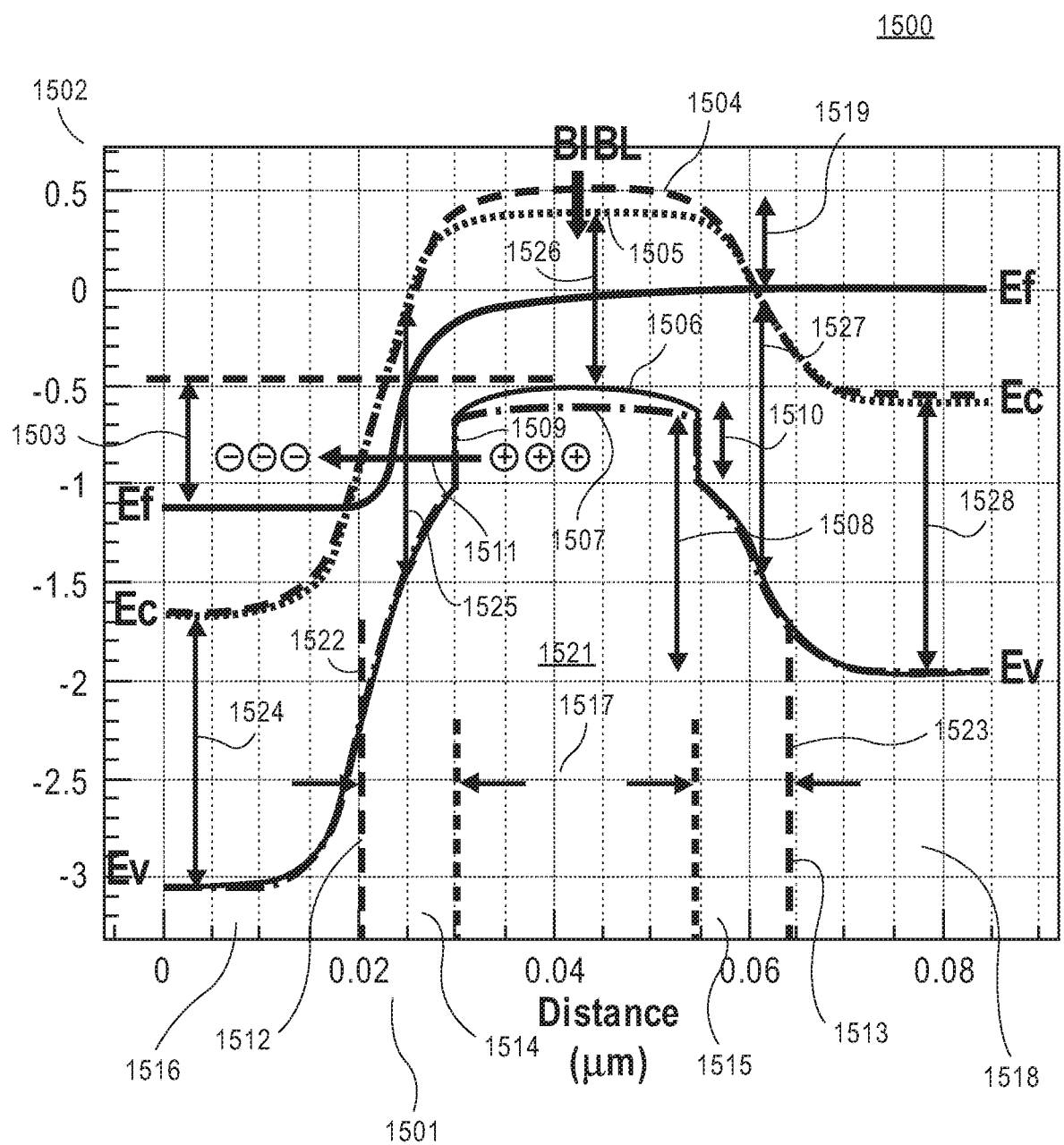
FIG. 15 is a view illustrating an energy band diagram of the electronic device structure according to one embodiment.

FIG. 15 is a view 1500 illustrating an energy band diagram of the electronic device structure according to one embodiment. As shown in FIG. 15, the energy band diagram includes an energy 1502 of electric current carriers, such as electrons and holes as a function of a distance 1501 along the electronic device structure. The electronic device structure includes a channel region 1521 between a wide bandgap drain region 1516 and a wide bandgap source region 1518. The channel region 1521 includes a narrow bandgap channel portion 1517 between a wide bandgap channel portion 1514 and a wide bandgap channel portion 1515. The wide bandgap channel portion 1514 is adjacent to the wide bandgap drain region 1516. The wide bandgap channel portion 1515 is adjacent to the wide bandgap source region 1518. In one embodiment, the channel region 1521 represents the channel region 1008, the wide bandgap drain region 1516 and wide bandgap source region 1518 represent the wide bandgap source/drain regions 901 and 902 depicted in FIGS. 10 and 11. In one embodiment, the wide bandgap channel portion 1514 and the wide bandgap channel portion 1515 represent parts of the wide bandgap semiconductor portions 801 and 802 depicted in FIGS. 10 and 11.

As shown in FIG. 15, the wide bandgap channel portion 1514, narrow bandgap channel portion 1517 and the wide bandgap channel portion 1515 are beneath the gate electrode (not shown). As shown in FIG. 15, the channel region 1521 including the wide bandgap channel portion 1514, narrow bandgap channel portion 1517 and the wide bandgap channel portion 1515 is within edges 1522 and 1513 of the gate electrode. As shown in FIG. 15, the wide bandgap drain region 1516 and the wide bandgap source region 1518 are outside of the gate electrode edges 1522 and 1523.

As shown in FIG. 15, at the bias voltage Vd substantially equal to about 1.1V (Ef_s at distance 0.085 um–Ef_d at distance 0), the wide bandgap drain region 1516 has a conduction energy band $E_c$ and a valence energy band $E_v$ that are separated by a bandgap Eg 1524, wide bandgap channel portion 1514 has a conduction energy band $E_c$ and a valence energy band $E_v$ that are separated by a bandgap Eg 1525, narrow bandgap channel region 1517 has a conduction energy band $E_c$ and a valence energy band $E_v$ that are separated by a bandgap Eg 1526, the wide bandgap channel portion 1515 has a conduction energy band $E_c$ and a valence energy band $E_v$ that are separated by a bandgap Eg 1527, and the wide bandgap source region 1518 has a conduction energy band $E_c$ and a valence energy band $E_v$ that are separated by a bandgap Eg 1528. As shown in FIG. 15, each of the bandgaps 1524, 1525, 1527 and 1528 is greater than a bandgap Eg 1526 of the narrow bandgap channel region 1517. In one embodiment, the values of the bandgaps 1524, 1525, 1527 and 1528 are substantially the same. As shown in FIG. 15, the valence band of the wide bandgap channel portions 1514 and 1515 has a valence band offset VBO 1509 and 1510 underneath the gate electrode within the edges 1522 and 1523 relative to the valence band of the narrow bandgap channel region 1517. As shown in FIG. 15, the conduction band Ec of each of the wide bandgap channel portions 1514 and 1515 has a substantially zero offset relative to the conduction band Ec of the narrow bandgap channel portion 1517.

As shown in FIG. 15, at the bias voltage Vd substantially equal to about 1.1V, the valence band in the narrow bandgap channel region 1517 is at an energy level 1506, which is above the Fermi level Ef of the wide bandgap drain region 1516. As the energy states above Ef are empty while the energy states below energy level 1506 are filled with electrons, a BTBT window 1503 exists between energy level 1506 and the Fermi level Ef of the wide bandgap drain region 1516 within which electrons from the occupied states below energy level 1506 can tunnel to the empty states above the Fermi level Ef of the wide bandgap drain region 1516 through the bandgap 1525 of the wide bandgap channel portion 1514. Because the wide bandgap channel portion 1514 coincides with the BTBT window, the tunneling width for electrons to tunnel through is increased by the valance band offset VBO 1509 and, as a result, the tunneling rates are reduced exponentially. As shown in FIG. 15, electrons tunnel within the BTBT window 1503 from the valence band Ev of the narrow bandgap channel region 1517 through the width of the wide bandgap channel portion 1514 to the conduction band Ec of the wide bandgap drain region 1516 above the Fermi level Ef.

As shown in FIG. 15, the valence band of the wide bandgap channel region 1515 has a valence band offset VBO 1510 underneath the gate electrode relative to the valence band of the narrow bandgap channel region 1517. As shown in FIG. 15, the valence band of the narrow bandgap channel region 1517 is below the Fermi level Ef of the wide bandgap source region 1518 so that there is no BTBT window created. That is, electrons below energy level 1506 cannot tunnel to the conduction band Ec of wide bandgap source region 1518 through the bandgap 1510 because there are not empty states for electrons to occupy below the Fermi level Ef of the wide bandgap source region 1518. The wide bandgap channel portion 1514 placed under the gate contains the BTBT window 1503 in the substantially high electric field region. In one embodiment, the electric field in the wide bandgap channel portion 1514 is at least $10^6$ V/cm. As shown in FIG. 15, the BTBT window in the high electric field region has the wide bandgap channel portion 1514. The wide bandgap channel portion 1514 increases the tunneling width from the narrow bandgap channel region 1517 to the wide bandgap drain region 1516 that significantly lowers the BTBT rate comparing to the BTBT rate of the semiconductor structure illustrated in FIG. 13. In one embodiment, as the width of the wide bandgap channel region 1514 increases, the width of the tunnel for the carriers increases. In more specific embodiment, the electronic device with the wide bandgap channel region 1514 having the width of about 10 nm increases the carrier tunnel width so that the BTBT reduces in about 40 times comparing to the BTBT of the electronic device that does not have the wide bandgap channel region.

As the BTBT rate is lowered, the floating charge that increases an energy of the valence band Ev in the narrow bandgap channel region 1517 from an energy level 1507 to an energy level 1506 is reduced comparing to the floating charge of the electronic device structure depicted in FIG. 13. As the BTBT rate is lowered, the BIBL that reduces an energy barrier from a conduction band level 1504 to a conduction band level 1505 is reduced comparing to the BIBL of the electronic device structure depicted in FIG. 13.

As shown in FIG. 15, an energy barrier 1519 is generated by the gate-source field between the Fermi level Ef of the wide bandgap source region 1518 and the conduction band 1504 of the narrow bandgap channel region 1517 for thermal electrons that travel from the wide bandgap source region 1518 to the narrow bandgap channel region 1517 above the Fermi level. As shown in FIG. 15, an energy barrier 1508 is generated by the same gate-source field plus the VBO 1510 between energy level 1506 of the valence band in the narrow bandgap channel region 1517 and the valence band Ev of the wide bandgap source region 1518 for thermal holes that travel from the narrow bandgap channel region 1517 to the wide bandgap source region 1518. As holes generated by BTBT 1511 cannot overcome the large energy barrier 1508, the holes remain in the narrow bandgap channel region 1517. This causes the floating charge effect that lowers the conduction band Ec from energy level 1504 to energy level 1505, and valence band Ev from energy level 1506 to energy level 1507. The floating charge effect reduces the thermal barrier for electrons 1519 that increases the thermionic leakage BIBL.

Figure 16:
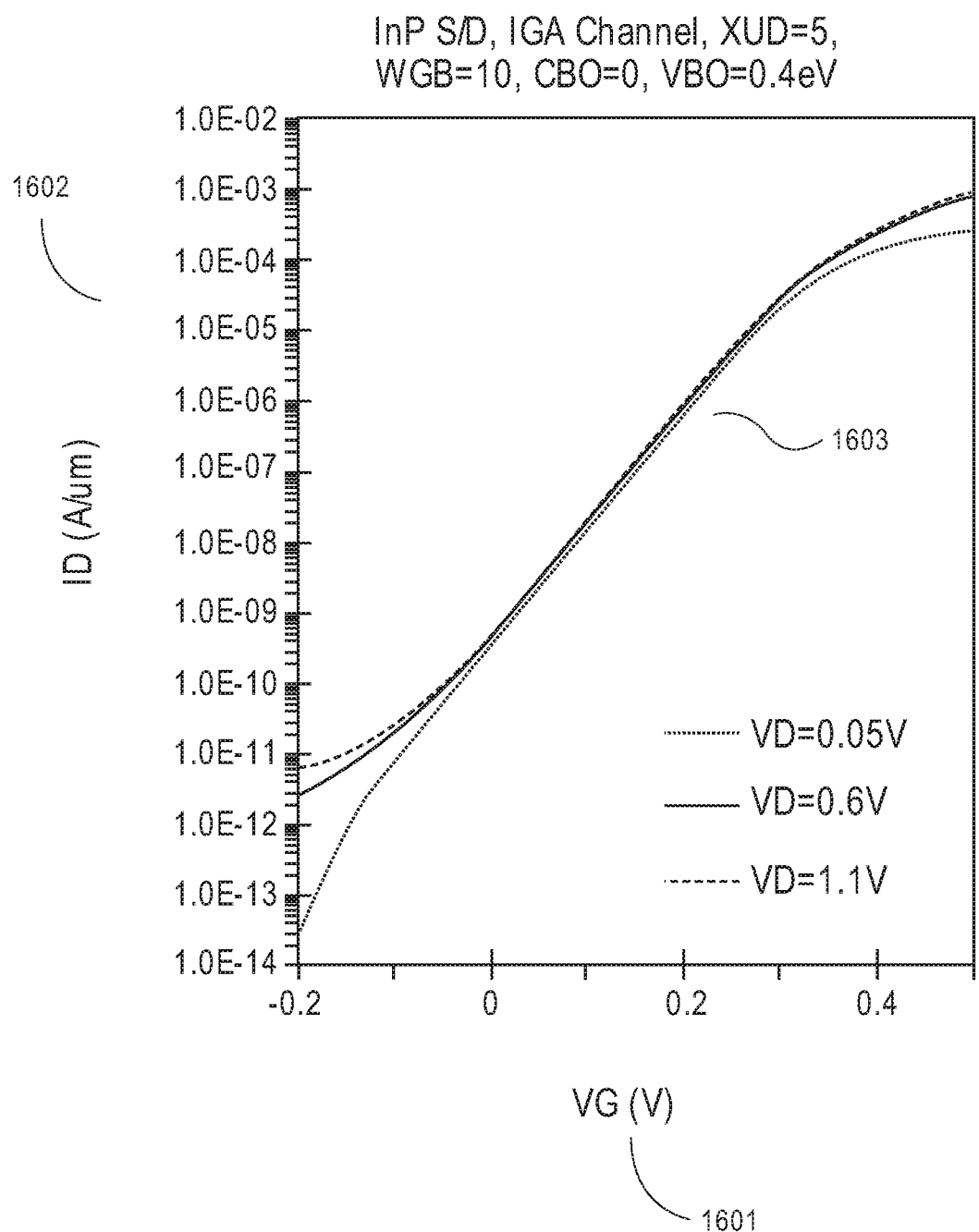
FIG. 16 is a view of a graph including a set of curves showing an off-state leakage drain current Id of a narrow bandgap transistor having the wide bandgap channel portions as a function of a gate voltage Vg at different drain voltages according to one embodiment.

FIG. 16 is a view 1600 of a graph including a set of curves 1603 showing an off-state leakage drain current Id 1601 of a narrow bandgap transistor having the wide bandgap channel portions as a function of a gate voltage Vg 1402 at different drain voltages according to one embodiment. In one embodiment, the narrow bandgap transistor has a structure that is similar to the narrow bandgap electronic device structure depicted in FIGS. 10 and 11. In one embodiment, the transistor has InP source/drain regions, the channel region including the InGaAs narrow bandgap portion between the InP wide bandgap portion, the width of each of the wide bandgap channel portions is about 10 nm, centered at the gate edge (and extending 5 nm from the gate edge), and the VBO is about 0.4 electron volts (eV). As shown in FIG. 15, the off-state drain leakage Id does not increase as the bias voltage between the source and drain Vd increases. As shown in FIG. 15, the off-state leakage current is not elevated with increasing the drain bias Vd.

Figure 17:
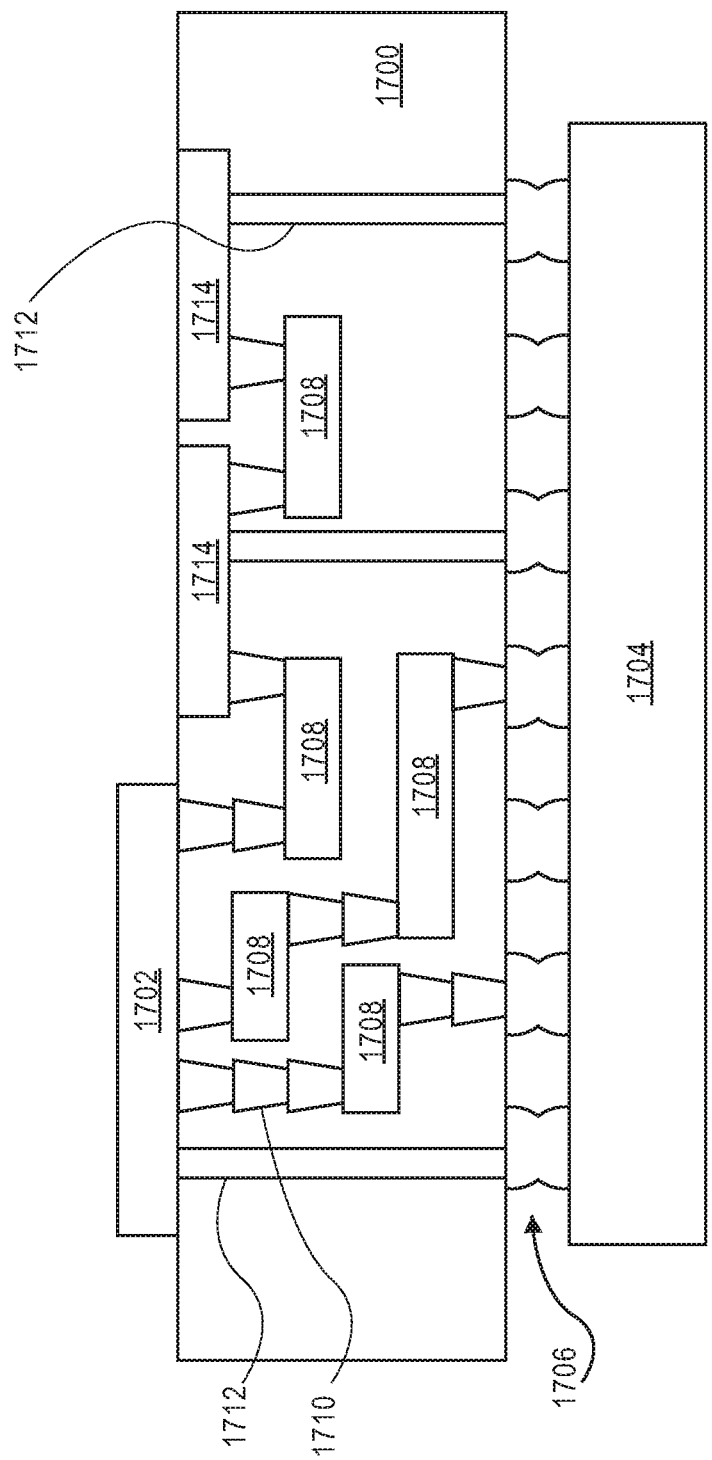
FIG. 17 illustrates an interposer that includes one or more embodiments of the invention.

FIG. 17 illustrates an interposer 1700 that includes one or more embodiments of the invention. The interposer 1700 is an intervening substrate used to bridge a first substrate 1702 to a second substrate 1704. The first substrate 1702 may be, for instance, an integrated circuit die that includes the transistors as described herein, diodes, memory devices, or other semiconductor devices. The second substrate 1704 may be, for instance, a memory module, a computer motherboard, or another integrated circuit die that includes the transistors, as described herein. Generally, the purpose of an interposer 1700 is to spread a connection to a wider pitch or to reroute a connection to a different connection. For example, an interposer 1700 may couple an integrated circuit die to a ball grid array (BGA) 1706 that can subsequently be coupled to the second substrate 1704. In some embodiments, the first and second substrates 1702/1704 are attached to opposing sides of the interposer 1700. In other embodiments, the first and second substrates 1702/1704 are attached to the same side of the interposer 1700. And in further embodiments, three or more substrates are interconnected by way of the interposer 1700.

The interposer 1700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as but not limited to silicon, germanium, group III-V and group IV materials.

The interposer may include metal interconnects 1708, vias 1710 and through-silicon vias (TSVs) 1712. The interposer 1700 may further include embedded devices 1714, including passive and active devices that include the transistors as described herein. The passive and active devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1700. In accordance with embodiments of the invention, apparatuses or processes disclosed herein may be used in the fabrication of interposer 1700.

Figure 18:
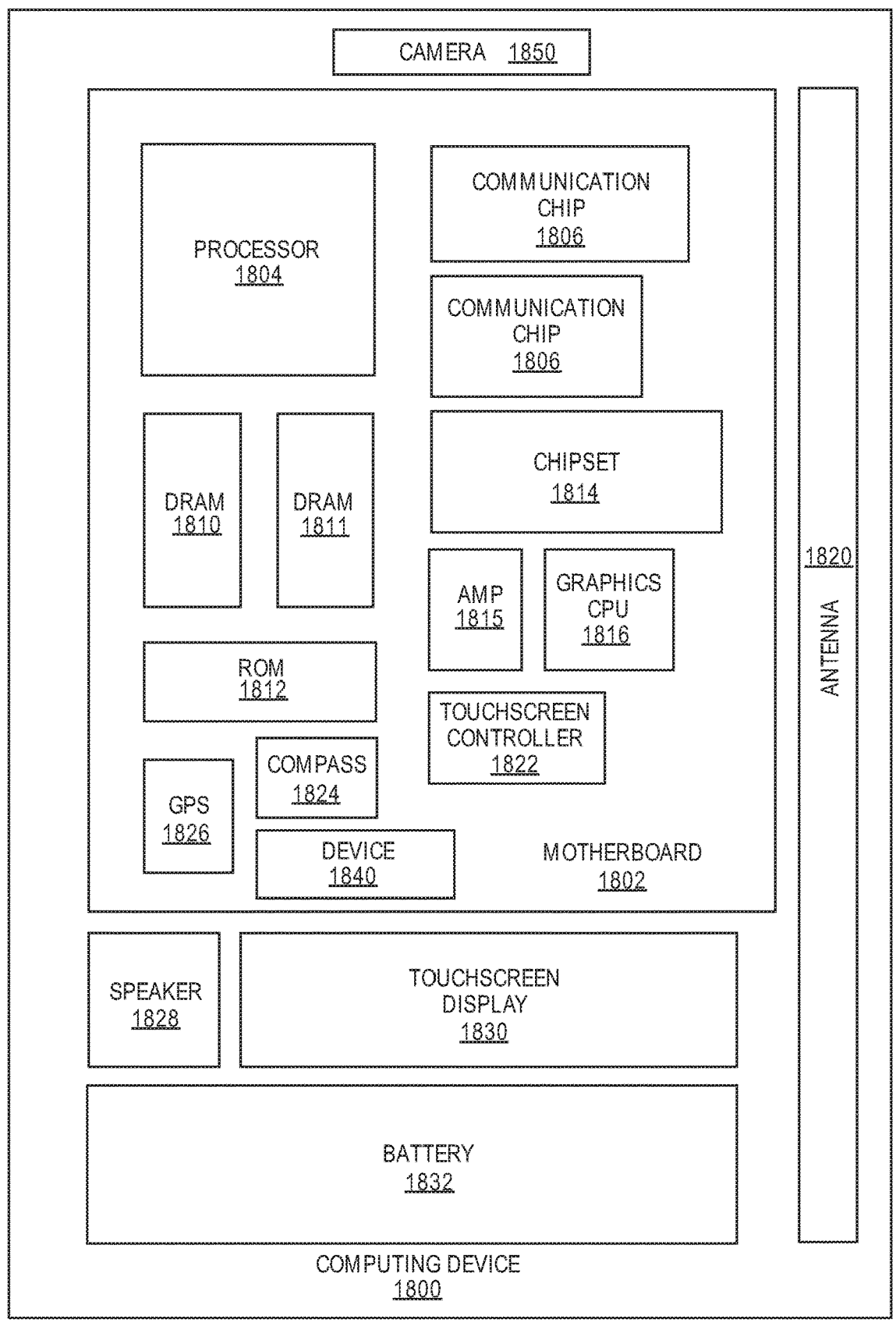
FIG. 18 illustrates a computing device in accordance with one embodiment.

FIG. 18 illustrates a computing device 1800 in accordance with one embodiment of the invention. The computing device 1800 houses a board 1802. The board 1802 may include a number of components, including but not limited to a processor 1804 and at least one communication chip 1806. The processor 1804 is physically and electrically coupled to the board 1802. In some implementations the at least one communication chip is also physically and electrically coupled to the board 1802. In further implementations, at least one communication chip 1806 is part of the processor 1804.

Depending on the application, computing device 1800 may include other components that may or may not be physically and electrically coupled to the board 1802. These other components include, but are not limited to, a memory, such as a volatile memory 1810 (e.g., a DRAM), a non-volatile memory 1812 (e.g., ROM), a flash memory, an exemplary graphics processor 1816, a digital signal processor (not shown), a crypto processor (not shown), a chipset 1814, an antenna 1820, a display, e.g., a touchscreen display 1830, a display controller, e.g., a touchscreen controller 1822, a battery 1832, an audio codec (not shown), a video codec (not shown), an amplifier, e.g., a power amplifier 1815, a global positioning system (GPS) device 1826, a compass 1824, an accelerometer (not shown), a gyroscope (not shown), a speaker 1828, a camera 1850, and a mass storage device (such as hard disk drive, compact disk (CD), digital versatile disk (DVD), and so forth) (not shown).

A communication chip, e.g., communication chip 1806, enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communication chips. For instance, one of the communication chips 1806 may be dedicated to shorter range wireless communications such as Wi-Fi and Bluetooth and the other one of the communication chips 1806 may be dedicated to longer range wireless communications such as GPS, EDGE, GPRS, CDMA, WiMAX, LTE, Ev-DO, and others.

In at least some embodiments, the processor 1804 of the computing device 1800 includes an integrated circuit die having one or more electronic devices, e.g., transistors or other electronic devices, as described herein. The term "processor" may refer to any device or portion of a device that processes electronic data from registers and/or memory to transform that electronic data into other electronic data that may be stored in registers and/or memory.

The communication chip 1806 also includes an integrated circuit die package having the transistors, as described herein. In further implementations, another component housed within the computing device 1000 may contain an integrated circuit die package having the transistors, as described herein. In accordance with one implementation, the integrated circuit die of the communication chip includes one or more electronic devices including the transistors, or other electronic devices, as described herein. In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In Example 1, an electronic device comprises a semiconductor channel layer on a buffer layer on a substrate, the semiconductor channel layer having a first portion and a second portion adjacent to the first portion, the first portion comprising a first semiconductor, the second portion comprising a second semiconductor that has a bandgap greater than a bandgap of the first semiconductor; and a gate electrode on the semiconductor channel layer.

In Example 2, the subject matter of Example 1 can optionally include that the second semiconductor has a conduction band that has a zero offset relative to the conduction band of the first semiconductor.

In Example 3, the subject matter of any of Examples 1-2 can optionally include that the second semiconductor has a dopant concentration equal or smaller than $10^{16}$ atoms/$cm^3$.

In Example 4, the subject matter of any of Examples 1-3 can optionally include that each of the first semiconductor and the second semiconductor comprises a III-V semiconductor material.

In Example 5, the subject matter of any of Examples 1-4 can optionally include that the first semiconductor comprises indium gallium arsenide, indium arsenide, indium antimonide, indium gallium antimonide, indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_yP_{1-y}$), where $0 \le x \le 1$, $0 \le y \le 1$, or any combination thereof.

In Example 6, the subject matter of any of Examples 1-5 can optionally include that the second semiconductor comprises gallium arsenide, indium phosphide, gallium phosphide, indium gallium phosphide, aluminum gallium arsenide, gallium arsenide antimonide ($GaAs_xSb_{1-x}$) (where $0 \le x \le 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide $In_xGa_{1-x}P_ySb_{1-y}$ (where $0 \leq x \leq 0.3$, $0 \leq y \leq 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \leq x \leq 1$, $0 \leq y \leq 1$), or any combination thereof.

In Example 7, the subject matter of any of Examples 1-6 can optionally include that the width of the second portion is from 5 nanometers to 10 nanometers.

In Example 8, the subject matter of any of Examples 1-7 can optionally include a source/drain region in a recess in the semiconductor channel layer; and a gate dielectric on the semiconductor channel layer.

In Example 9, the subject matter of Example 8 can optionally include that the gate dielectric wraps around the semiconductor channel layer.

In Example 10, the subject matter of any of Examples 9-10 can optionally include that the source/drain region comprises a third semiconductor that has a bandgap greater than a bandgap of the first semiconductor.

In Example 11, the subject matter of any of Examples 1-10 can optionally include that the semiconductor channel layer is a part of a fin, a nanowire, or a nanoribbon.

In Example 12, the subject matter of any of Examples 1-11 can optionally include that the first portion of the semiconductor channel layer comprises an undercut region extending laterally underneath the gate electrode, and wherein the second portion is in the undercut region.

In Example 13, a system comprises a chip including an electronic device comprising a semiconductor channel layer on a buffer layer on a substrate, the semiconductor channel layer having a first portion and a second portion adjacent to the first portion, the first portion comprising a first semiconductor, the second portion comprising a second semiconductor that has a bandgap greater than a bandgap of the first semiconductor; and a gate electrode on the semiconductor channel layer.

In Example 14, the subject matter of any of Example 13 can optionally include that the second semiconductor has a conduction band that has a zero offset relative to the conduction band of the first semiconductor.

In Example 15, the subject matter of any of Examples 13-14 can optionally include that the second semiconductor has a dopant concentration equal or smaller than $10^{16}$ atoms/cm$^{3}$.

In Example 16, the subject matter of any of Examples 13-15 can optionally include that each of the first semiconductor and the second semiconductor comprises a III-V semiconductor material.

In Example 17, the subject matter of any of Examples 13-16 can optionally include that the first semiconductor comprises indium gallium arsenide, indium arsenide, indium antimonide, indium gallium antimonide, indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_yP_{1-y}$), where $0 \leq x \leq 1$, $0 \leq y \leq 1$, or any combination thereof.

In Example 18, the subject matter of any of Examples 13-17 can optionally include that the second semiconductor comprises gallium arsenide, indium phosphide, gallium phosphide, indium gallium phosphide, aluminum gallium arsenide, gallium arsenide antimonide ($GaAs_xSb_{1-x}$) (where $0 \leq x \leq 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide ($In_xGa_{1-x}P_ySb_{1-y}$) (where $0 \leq x \leq 0.3$, $0 \leq y \leq 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \leq x \leq 1$, $0 \leq y \leq 1$), or any combination thereof.

In Example 19, the subject matter of any of Examples 13-18 can optionally include that the width of the second portion is from 5 nanometers to 10 nanometers.

In Example 20, the subject matter of any of Examples 13-19 can optionally include a source/drain region on the buffer layer; and a gate dielectric on the semiconductor channel layer. In Example 21, the subject matter of Example 20 can optionally include that the gate dielectric wraps around the semiconductor channel layer.

In Example 22, the subject matter of any of Examples 20-21 can optionally include that the source/drain region comprises a third semiconductor that has a bandgap greater than a bandgap of the first semiconductor.

In Example 23, the subject matter of any of Examples 13-22 can optionally include that the semiconductor channel layer is a part of a fin, a nanowire, or a nanoribbon.

In Example 24, the subject matter of any of Examples 13-23 can optionally include that the first portion of the semiconductor channel layer comprises an undercut region extending laterally underneath the gate electrode, and wherein the second portion is in the undercut region.

In Example 25, a method to manufacture an electronic device comprises depositing a semiconductor channel layer comprising a first semiconductor on a buffer layer on a substrate; forming a gate electrode on the semiconductor channel layer; forming an undercut region in the semiconductor channel layer; depositing a second semiconductor in the undercut region, wherein the second semiconductor that has a bandgap greater than a bandgap of the first semiconductor.

In Example 26, the subject matter of any of Example 25 can optionally include that the second semiconductor has a conduction band that has a zero offset relative to the conduction band of the first semiconductor.

In Example 27, the subject matter of any of Examples 25-26 can optionally include that the second semiconductor has a dopant concentration equal or smaller than $10^{16}$ atoms/cm$^{3}$.

In Example 28, the subject matter of any of Examples 25-27 can optionally include that each of the first semiconductor and the second semiconductor comprises a III-V semiconductor material.

In Example 29, the subject matter of any of Examples 25-28 can optionally include that the first semiconductor comprises indium gallium arsenide, indium arsenide, indium antimonide, indium gallium antimonide, or any combination thereof.

In Example 30, the subject matter of any of Examples 25-29 can optionally include that the second semiconductor comprises indium phosphide, gallium phosphide, indium gallium phosphide, or any combination thereof.

In Example 31, the subject matter of any of Examples 25-30 can optionally include that the width of the second portion is from 5 nanometers to 10 nanometers.

In Example 32, the subject matter of any of Examples 25-31 can optionally include forming a spacer on the gate electrode; etching a portion of the semiconductor channel layer outside the gate electrode to form a recess; and depositing a source/drain region in the recess.

In Example 33, the subject matter of Example 32 can optionally include that the second semiconductor is deposited in the undercut region through the recess.

In Example 34, the subject matter of any of Examples 25-33 can optionally include that the semiconductor channel layer is a part of a fin, a nanowire, or a nanoribbon.

In Example 35, the subject matter of any of Examples 25-34 can optionally include that the second semiconductor that has a bandgap greater than a bandgap of the first semiconductor, wherein the undercut region is formed using a wet etch.

In Example 36, the subject matter of any of Examples 25-35 can optionally include removing the gate electrode; depositing a gate dielectric on the semiconductor channel layer; and forming a metal gate stack on the gate dielectric.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a semiconductor channel layer on a semiconductor buffer layer on a substrate, wherein the semiconductor buffer layer and a portion of the semiconductor channel layer are in a trench in a dielectric layer above the substrate, the semiconductor channel layer having a first portion and a second portion laterally adjacent to the first portion, the first portion comprising a first semiconductor, the second portion comprising a second semiconductor that has a bandgap greater than a bandgap of the first semiconductor; and
   a gate electrode on the semiconductor channel layer, wherein the first portion of the semiconductor channel layer comprises an undercut region extending laterally underneath the gate electrode, and wherein the second portion is in the undercut region.

2. The electronic device of claim 1, wherein the second semiconductor has a conduction band that has a zero offset relative to the conduction band of the first semiconductor.

3. The electronic device of claim 1, wherein the second semiconductor has a dopant concentration equal or smaller than $10^{\wedge}16$ atoms/cm$^{\wedge}3$.

4. The electronic device of claim 1, wherein each of the first semiconductor and the second semiconductor comprises a III-V semiconductor material.

5. The electronic device of claim 1, wherein the first semiconductor comprises indium gallium arsenide, indium arsenide, indium antimonide, indium gallium antimonide, indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In^xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_ySb_{1-y}$), where 0.ltoreq.x.ltoreq.1, $0 \leq y \leq 1$, or any combination thereof.

6. The electronic device of claim 1, wherein the second semiconductor comprises gallium arsenide, indium phosphide, gallium phosphide, indium gallium phosphide, aluminum gallium arsenide, gallium arsenide antimonide ($GaAs_xSb_{1-x}$) (where $0 \leq x \leq 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide $In_xGa_{1-x}P_ySb_{1-y}$ (where $0 \leq x \leq 0.3$, $0 \leq y \leq 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \leq x \leq 1$, $0 \leq y \leq 1$), or any combination thereof.

7. The electronic device of claim 1, wherein the width of the second portion is from 5 nanometers to 10 nanometers.

8. The electronic device of claim 1, further comprising a source/drain region in a recess in the semiconductor channel layer; and a gate dielectric on the semiconductor channel layer.

9. A system comprising:
   a chip including an electronic device comprising a semiconductor channel layer on a semiconductor buffer layer on a substrate, wherein the semiconductor buffer layer and a portion of the semiconductor channel layer are in a trench in a dielectric layer above the substrate, the semiconductor channel layer having a first portion and a second portion laterally adjacent to the first portion, the first portion comprising a first semiconductor, the second portion comprising a second semiconductor that has a bandgap greater than a bandgap of the first semiconductor; and
   a gate electrode on the semiconductor channel layer, wherein the first portion of the semiconductor channel layer comprises an undercut region extending laterally underneath the gate electrode, and wherein the second portion is in the undercut region.

10. The system of claim 9, wherein the second semiconductor has a conduction band that has a zero offset relative to the conduction band of the first semiconductor.

11. The system of claim 9, wherein the second semiconductor has a dopant concentration equal or smaller than $10^{\wedge}16$ atoms/cm$^{\wedge}3$.

12. The system of claim 9, wherein each of the first semiconductor and the second semiconductor comprises a III-V semiconductor material.

13. The system of claim 9, wherein the first semiconductor comprises indium gallium arsenide, indium arsenide, indium antimonide, indium gallium antimonide, indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$) indium aluminum arsenide antimonide ($In_xAl_{1-x}As_ySb_{1-y}$), indium aluminum arsenide phosphide ($In_xAl_{1-x}As_yP_{1-y}$), where $0 \leq x \leq 1$, $0 \leq y \leq 1$, or any combination thereof.

14. The system of claim 9, wherein the second semiconductor comprises gallium arsenide, indium phosphide, gallium phosphide, indium gallium phosphide, aluminum gallium arsenide, gallium arsenide antimonide ($GaAs_xSb_{1-x}$) (where $0 \leq x \leq 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide $In_xGa_{1-x}P_ySb_{1-y}$(where $0 \leq x \leq 0.3$, $0 \leq y \leq 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \leq x \leq 1$, $0 \leq y \leq 1$), or any combination thereof.

15. The system of claim 9, wherein the width of the second portion is from 5 nanometers to 10 nanometers.

16. The system of claim 9, further comprising a source/drain region on the semiconductor buffer layer; and a gate dielectric on the semiconductor channel layer.

17. A method to manufacture an electronic device, comprising:
   depositing a semiconductor channel layer comprising a first semiconductor on a semiconductor buffer layer on a substrate, wherein the semiconductor buffer layer and a portion of the semiconductor channel layer formed in a trench in a dielectric layer above the substrate;
   forming a gate electrode on the semiconductor channel layer;

forming an undercut region in the semiconductor channel layer to form an undercut Portion of the semiconductor channel layer;

depositing a second semiconductor in the undercut region, wherein the second semiconductor that has a bandgap greater than a bandgap of the first semiconductor, and wherein the second semiconductor is laterally adjacent to the undercut portion of the semiconductor channel layer.

18. The method of claim 17, wherein the second semiconductor has a conduction band that has a zero offset relative to the conduction band of the first semiconductor.

19. The method of claim 17, wherein the second semiconductor has a dopant concentration equal or smaller than 10^16 atoms/cm^3.

20. The method of claim 17, wherein each of the first semiconductor and the second semiconductor comprises a III-V semiconductor material.

21. The method of claim 17, wherein the first semiconductor comprises indium gallium arsenide, indium arsenide, indium antimonide, indium gallium antimonide, indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As^yP_{1-y}$), where $0 \leq x \leq 1$, $0 \leq y \leq 1$, or any combination thereof.

22. The method of claim 17, wherein the second semiconductor comprises gallium arsenide, indium phosphide, gallium phosphide, indium gallium phosphide, aluminum gallium arsenide, gallium arsenide antimonide ($GaAs_xSb_{1-x}$) (where $0 \leq x \leq 1$), indium gallium arsenide antimonide ($In_xGa_{1-x}As_ySb_{1-y}$), indium gallium arsenide phosphide ($In_xGa_{1-x}As_yP_{1-y}$), indium gallium arsenide phosphide antimonide $In_xGa_{1-x}P_ySb_{1-y}$ (where $0 \leq x \leq 0.3$, $0 \leq y \leq 1$), indium aluminum arsenide antimonide $In_xAl_{1-x}As_ySb_{1-y}$, indium aluminum arsenide phosphide ($In_xAl_{1-x}As_yP_{1-y}$) (where $0.8 \leq x \leq 1$, $0 \leq y \leq 1$), or any combination thereof.

23. The method of claim 17, wherein the width of the second portion is from 5 nanometers to 10 nanometers.

24. The method of claim 17, further comprising:
forming a spacer on the gate electrode; etching a portion of the semiconductor channel layer outside the gate electrode to form a recess; and
depositing a source/drain region in the recess.

* * * * *